United States Patent [19]
Ohta et al.

[11] Patent Number: 5,543,689
[45] Date of Patent: Aug. 6, 1996

[54] HIGH FREQUENCY POWER SOURCE HAVING CORRECTED POWER OUTPUT

[75] Inventors: Ryusuke Ohta; Yoshihiro Sekizawa, both of Aizuwakamatsu, Japan

[73] Assignee: Fujitsu Limited, Kawasaki, Japan

[21] Appl. No.: 301,817

[22] Filed: Sep. 7, 1994

[30] Foreign Application Priority Data

Dec. 27, 1993 [JP] Japan .................................... 5-330663

[51] Int. Cl.$^6$ ................................ H05H 1/24; H03H 7/38
[52] U.S. Cl. ................................ 315/111.21; 315/111.41; 315/111.51
[58] Field of Search ........................ 315/111.21, 111.31, 315/111.41, 111.51, 111.61, 111.71, 111.81, 111.91

[56] References Cited

U.S. PATENT DOCUMENTS 4,629,940  12/1986  Gagne et al. ................. 315/111.51
5,383,019  1/1995  Farrell et al. .................... 356/316

*Primary Examiner*—Robert Pascal
*Assistant Examiner*—David Vu
*Attorney, Agent, or Firm*—Nikaido, Marmelstein, Murray & Oram LLP

[57] ABSTRACT

A high frequency power source of the invention comprises power supplying means for amplifying a high frequency signal and for supplying high frequency power; and output regulation means for monitoring the high frequency power and regulating the power supplying means according to the high frequency power.

A plasma generator comprises a chamber for generating plasma on the basis of high frequency power; and an high frequency power supply for supplying high frequency power to the chamber, the high frequency power supply includes, power supplying means for amplifying a high frequency signal and supplying high frequency power; and output regulation means for monitoring the high frequency power and power supplying means and regulating the power supplying means according to the high frequency power.

Another plasma generator comprises supplying means amplifying a DC signal or AC signal with a predetermined frequency for supplying a microwave; a detector for detecting the state of the microwave; a matching circuit for making impedance matching with respect to the microwave; and regulation means for monitoring the microwave and regulating the power of the microwave.

14 Claims, 17 Drawing Sheets

HIGH FREQUENCY POWER SOURCE HAVING CORRECTED POWER OUTPUT

BACKGROUND OF THE INVENTION

1. Field of the Invention

The invention relates to a high frequency (HF) power source and a plasma generator, and more particularly improvements of an apparatus for generating high frequency electric power necessary for plasma generation and an apparatus to which it was applied.

2. Description of the Related Art

With the requirement that the Large Scale Integrated circuits (LSIs) should be integrated into larger scale and higher density integration, a RF (radio frequency) sputtering apparatus, a plasma CVD apparatus, a dry etching apparatus, ashing apparatus and so forth are used for deposition and procession of thin films in manufacturing LSIs, liquid crystal displays, etc. For any of these apparatus, plasma is In such plasma-based systems, HF power supplies of, e,g,, a few hundred Khz to a few Ghz are used. RF frequencies, RF electric power (or electricity) ranging from a few ten watts to a few kilowatts is supplied the electrodes for plasma generation by amplifying a sine wave of a prescribed frequency by means of solid state devices or electron tubes, Further, in the range of microwaves, microwave electricity on the order of Ghz is generated by supplying low frequency or DC electricity to a klystron or a magnetron and is supplied to the electrodes for plasma generation. However, HF or microwave electric power supplied to those electrodes is not always According to the related art of the invention, an HF power source of a CVD (chemical vapor deposition) system for processing a semiconductor wafer 8 by means of plasma, as shown in FIG. 1, comprises a crystal oscillator 1, an HF amplifier 2, a power detector 3, a matching circuit 4 and a power detecting meter 6.

The power source functions as follows. The crystal oscillator 1 generates an HF signal with a frequency of 13.56 Mhz, which is amplified by the HF amplifier 2. The resultant HF electricity is supplied via the power detector 3 and the matching circuit 4 to between electrodes 5A and 5B that are provided within a vacuum chamber 7 where a wafer 8 is processed by means of plasma.

In order to make an impedance matching between the source and the load with respect to the frequency of the HF electricity, the user adjusts variable condensers of the matching circuit 4 referring to the power detecting meter 6. The power detecting meter 6 indicates the HF electric power on the basis of the detected and reflected wave or the incident wave of the power detector 3. Thus, HF electricity is supplied to the electrodes 5A and 5B within the chamber.

SUMMARY OF THE INVENTION

It is an object of the invention to generate and supply stable high frequency electricity to a chamber etc. by monitoring and automatically adjusting the HF electricity and the tuner set point to settle individual difference and a drift of the power detector.

It is the further object of the invention to hold down electric power loss other than electric power used for plasma to the minimum by detecting fluctuation in high frequency electricity in its early stage.

An HF power source of the invention comprises power supplying means, including an amplifier, for generating high frequency (HF) electric power (electricity) by amplifying an HF signal and output control means monitoring the HF electricity from the power supplying means for suppressing fluctuation in the HF electricity. The output control means includes a power detector for detecting the state of the HF electricity from the amplifier of the power supplying means and a controller for controlling the output of the amplifier in response to the detected state of the HF electricity from the power detector.

According to a first HF power source of the invention, it is provided with a controller obtaining control gain data from power-detected data, initial characteristic data and power-setting data for controlling the output of the amplifier in response to the control gain data.

The individual difference of the power detector is thus settled by automatically controlling the output of the amplifier on the basis of the control gain data.

The control gain data and the initial gain data are compared by a comparative operation section. If the result is wide of the control target, a warning signal is issued informing that a drift of the power detector has occurred, so that constant HF electricity can be supplied steadily to the load.

According to a second HF power source of the invention, it is provided with a controller obtaining matching point data from the power-detected data for adjusting the turner set point of the matching circuit from the matching point data.

If the turner set point of the matching circuit obtained at an operating time is wide of that of normal operating time, a warning signal is issued, which results in the early recognition that the impedance of the load has changed.

According to a third HF power source of the invention, it is provided with a controller sampling and holding waveform-detected data of the matching circuit and calculating the mean value and the standard deviation of peak values of the output waveform of the matching circuit from the waveform-detected data.

If a change in the mean value or the standard deviation of peak voltages of the output waveform of the matching circuit becomes larger than a predetermined value, then a warning signal is issued, which results in the early recognition that the impedance of the load has changed.

According to a first plasma generator of the invention, an HF power supply for supplying HF electricity to the electrodes for plasma generation includes an HF power source of the invention.

This enables the detection of any abnormal electric discharge or fluctuation in the gas flow within a plasma chamber and therefore the generation of plasma based on stable HF electricity. Furthermore, it is possible to reduce other electric power loss than electric power for plasma because the plasma density in the chamber can be maintained stably.

A second plasma generator of the invention is provided with a control device for controlling the outputs/inputs of an amplifier, a power detector and matching circuit. And the control device includes a controller of an HF power source of the invention.

The controller of the HF power source of the invention automatically controls the amplifier and the matching circuit so as to cause plasma to occur with stable HF electricity. Also, the settlement of individual difference of the power detector and the notification of a drift occurrence are possible.

Therefore, the present invention provides a high frequency power source wherein error correcting function, matching error monitoring function and peak voltage monitoring function are improved and greatly contributes to the offers of a reliable RF sputter apparatus, plasma CVD apparatus, dry etching apparatus, ashing apparatus, etc. to which the former HF power sources are applied.

DETAILED DESCRIPTION

Figure 1:
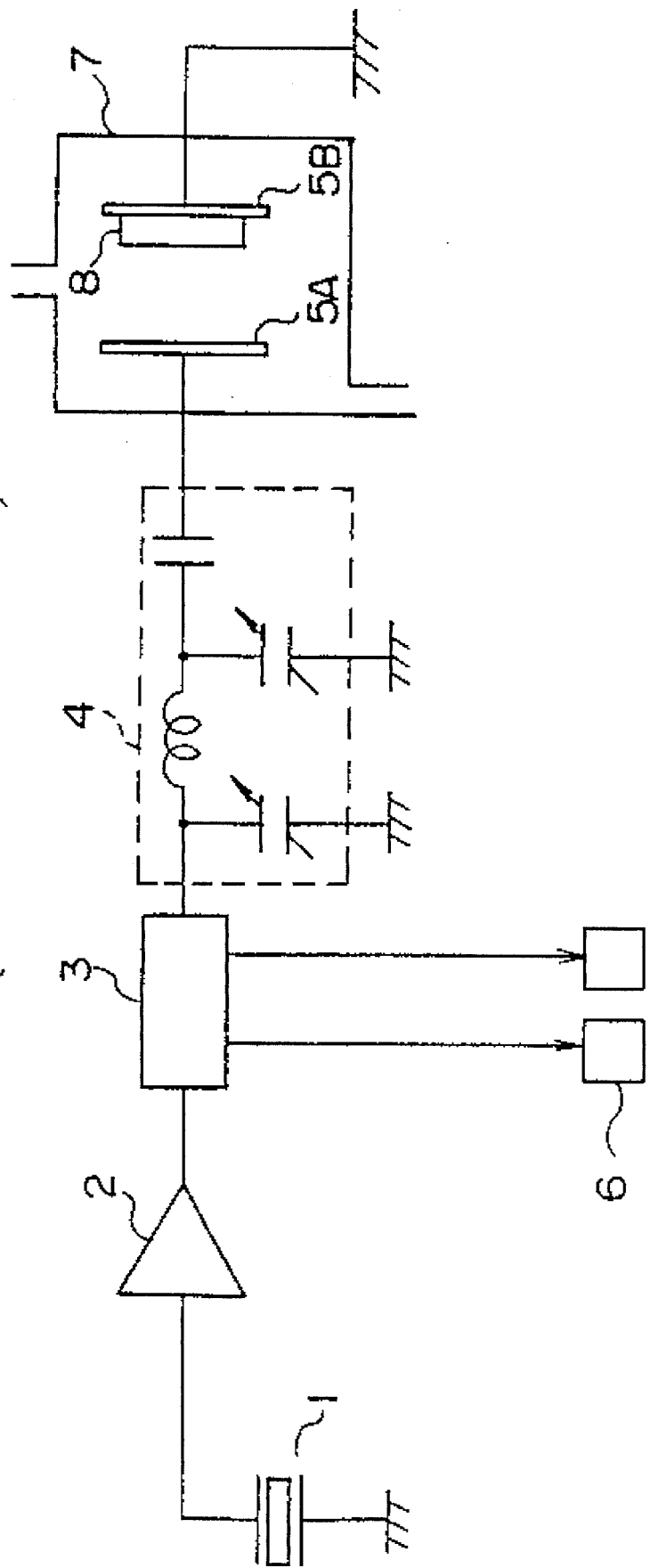
FIG. 1 is a diagram showing the arrangement of a high frequency power source for plasma generation according to the related art of the invention.

According to the related art, high frequency (HF) electricity supplied to electrodes 5A and 5B as shown in FIG. 1 is not necessarily stable. This is because an impedance matching of the load with respect to the supplied HF electricity is made by manually adjusting the variable capacitors etc. of matching circuit 4 referring to a power detecting meter 6.

Since the density of plasma in a vacuum chamber 7 tends to change, there is the possibility of changes in a growth rate, a coverage, an etching rete and/or a dimension selectively of a thin film.

One of the cause of these changes is that the HF electric power supplied to the electrodes 5A and 5B is detected differently depending on the power detecting meter 6 and the time because of individual difference and a drift of the power detector 3. The individual difference is caused by variation in components.

Among such variation there are, for example, variations in a coupling degree and an electromotive force of the thermoelectric couple in the power detecting meter 6 and variations in frequency characteristics and the power detecting meter 6, etc. A drift is caused by thermal deterioration of components, a change in a coupling degree due to a transformation and a change in the indication of the power detecting meter 6, etc.

Thus, in an actual manufacturing process, a regular manual calibration (error correction) of supplied electricity is forced.

Another cause of those changes is that the net electrical power supplied to the electrodes 5A and 5B varies because electric power is lost except for plasma. A power loss is caused, for example, by leakage of electricity due to a stain on the electrodes 5A and 5B or calorification by contact resistance between conductors.

Therefore, there is a problem that the application of high frequency power sources of the related art to a RF sputter apparatus, plasma CVD apparatus, dry etching apparatus, ashing apparatus, etc. will result in low reliability.

On the other hand, a principle HF power source of the invention comprises power supplying means for amplifying a high frequency signal and for supplying high frequency power; and output regulation means for monitoring the high frequency power and regulating the power supplying means according to the high frequency power. The output regulation means generates an alarm signal when selected one of the change in the mean value and the standard deviation of peak values of the output waveform exceeds a preset threshold value.

Figure 2:
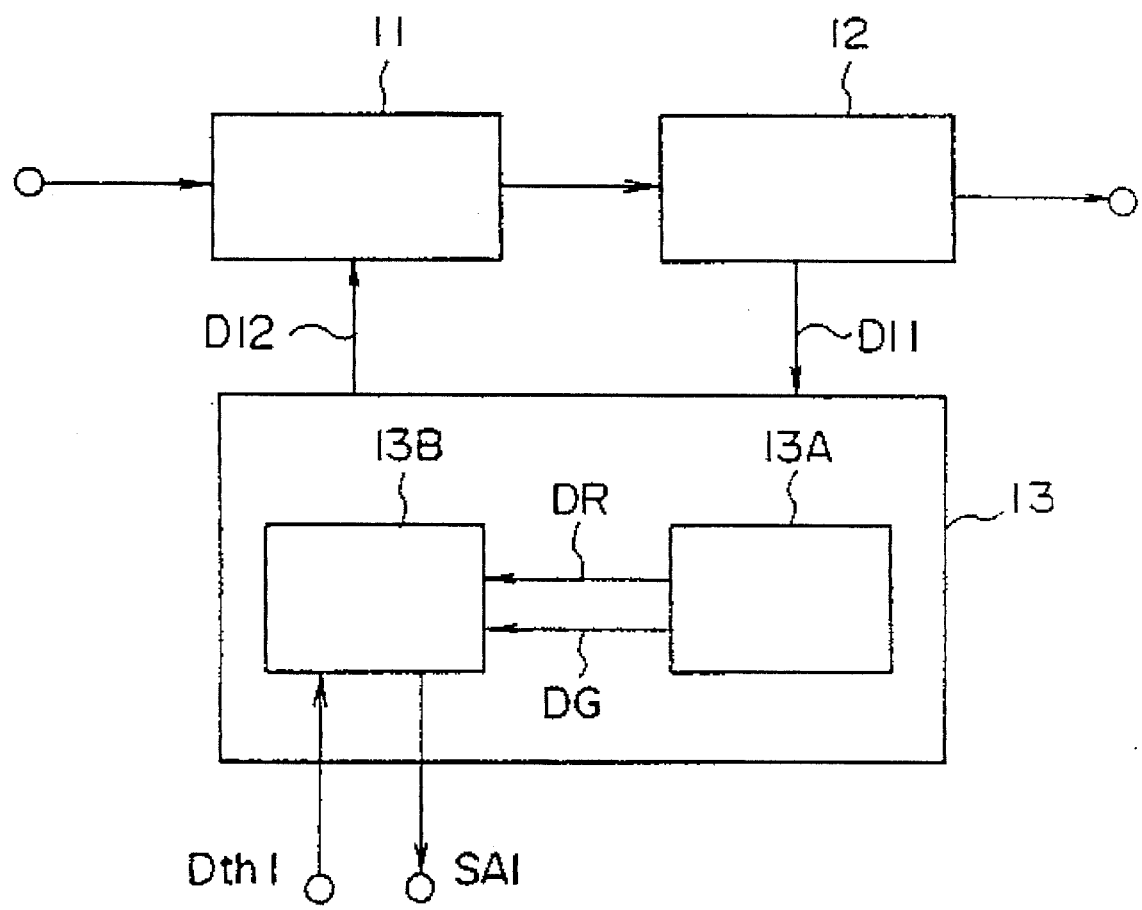
FIG. 2 through 4 are diagrams showing each arrangement of first through third theoretical high frequency power sources of the invention, respectively.

Specifically, a first HF power source of the invention, as shown in FIG. 2, is provided with an amplifier 11 for amplifying an input signal of a prescribed high frequency, a power detector 12 for detecting state of the amplified HF electricity, and a controller 13 obtaining control gain data D12 from detected-power data D11 to which the state on the amplified HF electricity is binary-coded, initial characteristic data DR and set-power data Dth1 for controlling the output of the amplifier 11 in response to the control gain data D12.

The initial characteristic data DR have been derived in advance from the actual measurement carried out by the inventors of the present invention. The initial characteristic data DR are values used to eliminate a power detection error (i.e., individual difference) of the power detector 12 and are also called as power correction values. The set-power date Dth1 is a set value used when the power is supplied to the load. The control gain data D12 is a value used to adjust the gain of the amplifier 11 and is also called as a gain adjusting value.

In the first HF power source of the invention, the controller 13 has: a memory 13A for storing initial characteristic data DR and initial gain data DG; and a comparative operation section 13B for calculating control target data from the initial characteristic data DR and the detected-power data D11 and for computing the control gain data D12 from the difference between the control target data and the power-setting data. The initial gain data DG provide an upper limit value and a lower limit value both defining a gain adjustable range of the amplifier 11. The control target data can be derived by subtracting the power correction data from the detected-power data D11 and is also called as a control target value. The control gain data D12 can be obtained by multiplying the control target value by a certain parameter and is used as a gain adjusting value. Also, the comparative operation section 13B compares the control gain data D12 and the initial gain data DG to issuing a warning signal SA1. The warning signal SQ1 is issued in case the gain adjusting value exceeds the upper limit value or the lower limit value of the gain adjustable tolerance.

Figure 3:
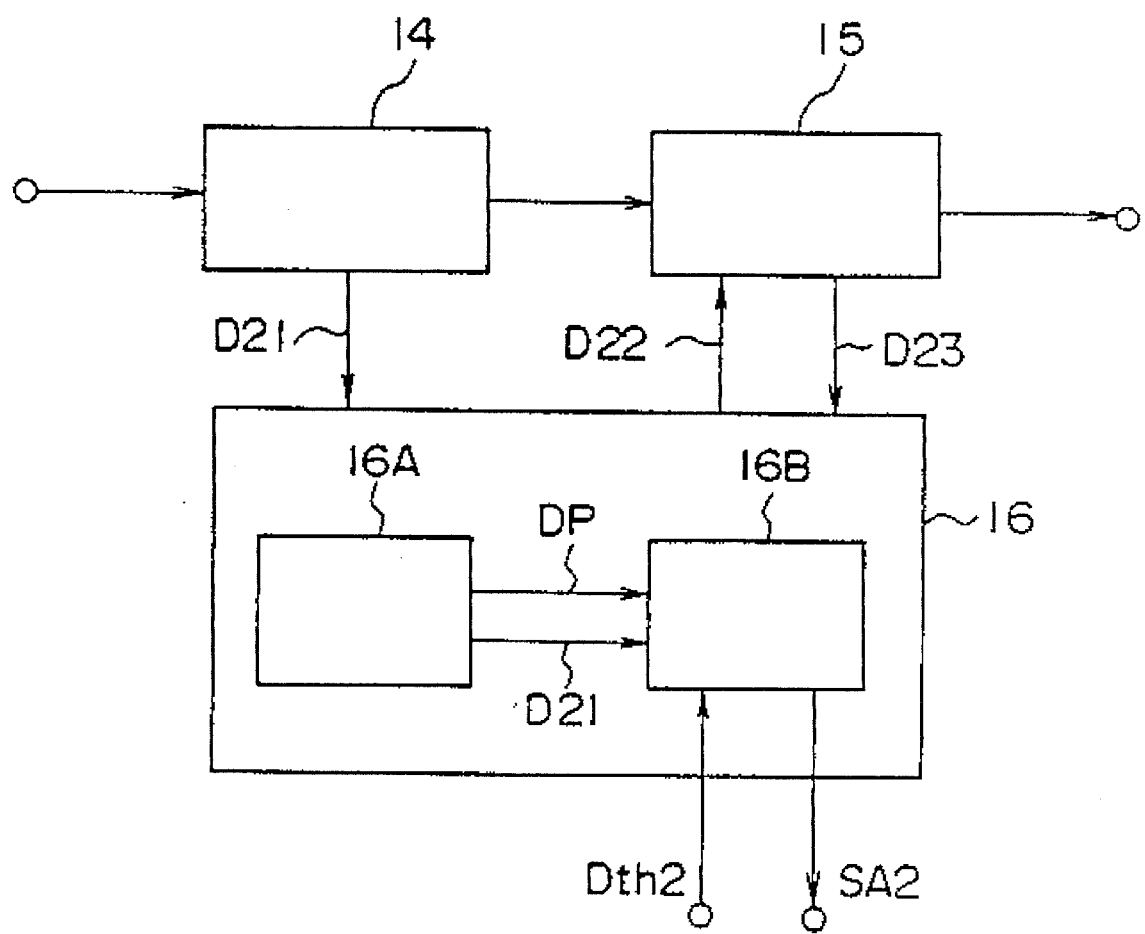

A second high frequency power source of the invention, as shown in FIG. 3, comprises a power detector 14 for detecting state of the amplified HF electricity, a matching circuit 15 for making an impedance matching with respect to the HF electricity, and a controller 16 obtaining matching point data D22 which is intended for adjusting the tuner set point of the matching circuit 15 from the detected-power data D21 into which the state on the detected HF power is binary-coded for controlling the output of the matching circuit 15 on the basis of the matching point data D22.

In the second high frequency power source of the invention, the controller 16 is provided with a memory 16A for storing detected-set-point data D23 into which state on the tuner set point of the matching circuit 15 is binary-coded, and a comparative operation section 16B obtaining control target data from the detected-set-point data D23 and the matching point data D22 for issuing a warning signal on the basis of the comparison between the control target data and the set-position data Dth2.

The detected-set-point data D23 indicates a tuning position of the matching circuit 15 corresponding to the power detection value detected by the power detector 14. The detected-set-point data D23 have been obtained in advance as standard values while the load operates normally. The control target data is a value used to drive the tuner and provides a control target value. The set-position data Dth2 is a value indicating a displacement tolerance of the tuning position and is referred to simply as a threshold value. The warning signal SA2 is issued if a difference between a standard position of the tuner which is read out from the memory 16A and a matching position derived by the controller 16 exceeds the threshold value.

Also, the comparative operation section 16B computes the matching position data D22 for adjusting the tuner set point of the matching circuit 15 from the detected-power data D21 which is a binary-converted version of the state on the detected HF electric power.

Figure 4:
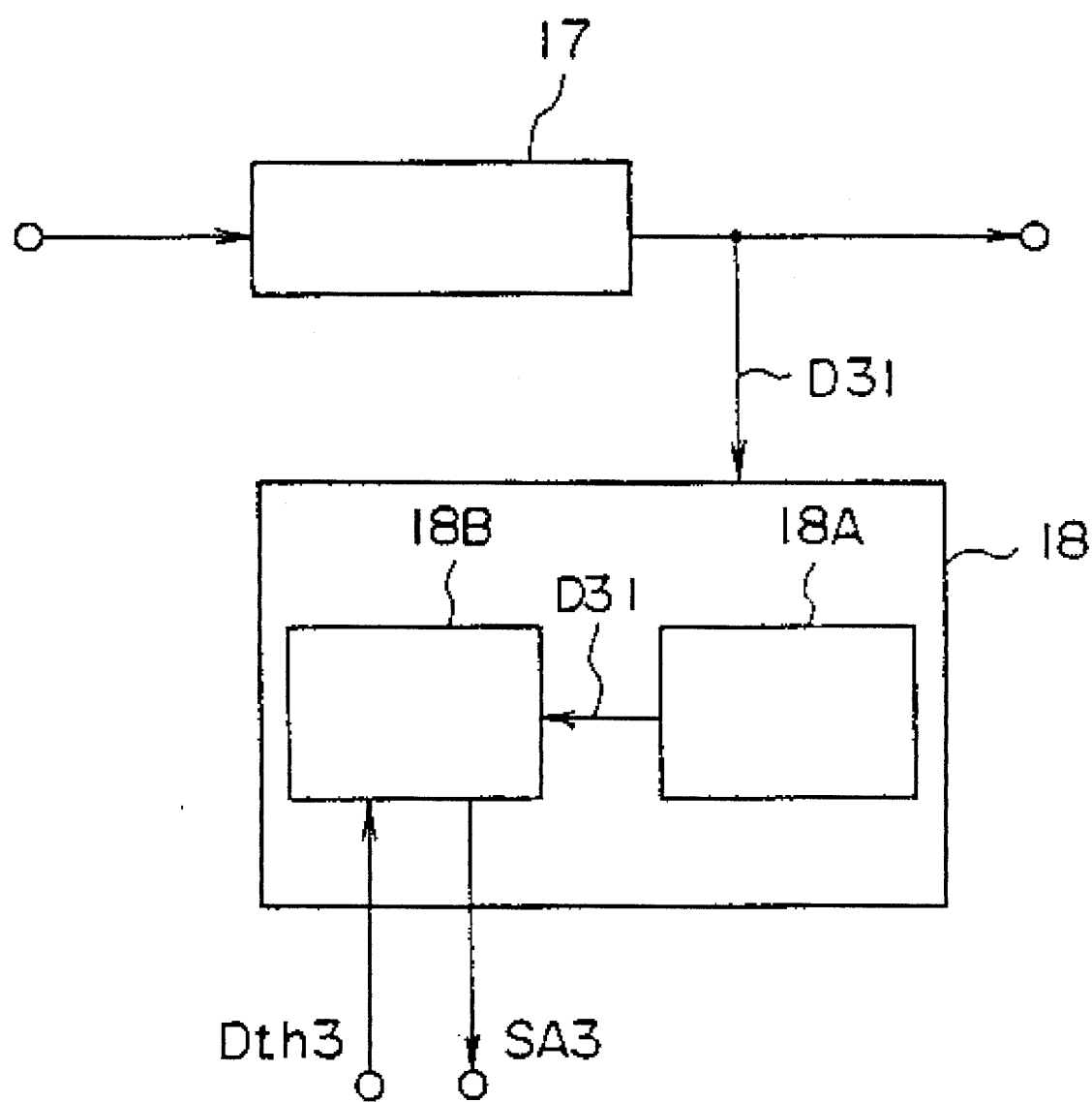

A third high frequency power source of the invention, as shown in FIG. 4, comprises a matching circuit 17 for matching the impedance between the power source and the load with respect to the frequency of the HF electricity and a controller 17 sampling and holding detected-waveform data D31 which is a binary-converted version of the state on the output waveform of the matching circuit 17 for calculating the mean value and the standard deviation of peak voltages of the output waveform of the matching circuit 17 from the sampled and held detected-waveform data D31.

In the third high frequency power source of the invention, the controller 18 includes a memory 18A for storing detected-waveform data D31 of the matching circuit 17 and a comparative operation section 18B sampling and holding the detected-waveform data D31 in the memory 18A for calculating the mean value and the standard deviation of peak voltages of the output waveform of the matching circuit 17 from the sampled and held detected-waveform data D31.

Also, in the third high frequency power source of the invention, if a change in the mean value and the standard deviation of peak voltages of the output waveform of the matching circuit 17 exceeds a preset threshold data Dth3, the comparative operation section 18B issues a warning signal SA3.

A principle plasma generator of the invention comprises a chamber for generating plasma on the basis of high frequency power; and an high frequency power supply for supplying high frequency power to the chamber, the high frequency power supply includes, power supplying means for amplifying a high frequency signal and supplying high frequency power; and output regulation means for monitoring the high frequency power and power supplying means and regulating the power supplying means according to the high frequency power.

Figure 5:
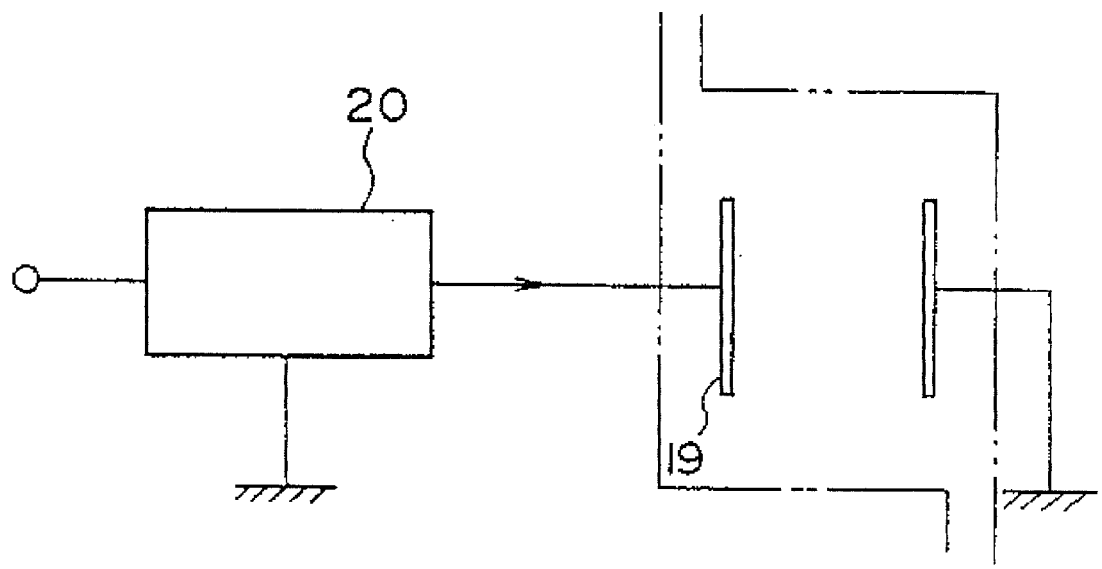
FIG. 5 and 6 are diagrams showing each arrangement of a first and a second theoretical plasma generators of the invention, respectively.

Namely, a first plasma generator, as shown in FIG. 5, comprises electrodes 19 disposed in a chamber in which plasma is generated and an HF power supply 20 which includes first through third HF power sources of the invention.

Figure 6:
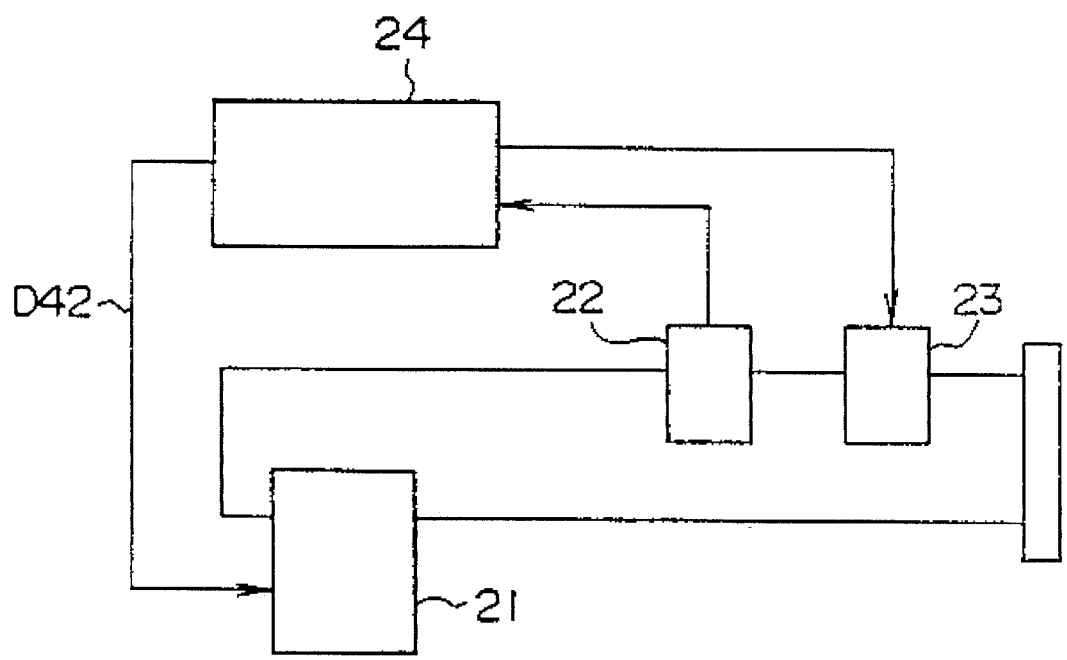

A second plasma generator, as shown in FIG. 6, comprises an amplifier 21 for amplifying an input signal of a prescribed frequency or a DC signal to yield microwave electricity, an electric power detector 22 for detecting the power of the amplified microwave electricity, a matching circuit 23 for making impedance matching with respect to the microwave electricity, a control device 24 for controlling inputs/outputs of the amplifier 21, the power detector 22 and the matching circuit 23. The control device 24 includes controllers of first through third HF power sources 13, 16 and 18 of the invention.

Now, we discuss the operation of the principle HF power source of the invention. For example, a electric power supplying means amplifies an HF signal to generate HF electricity, which an output control means monitors to hold down fluctuation in the HF electric power.

Thus, the output control means settles individual difference and a drift of a power detector to reduce other electric power loss than electric power for plasma to the minimum and to enable the stable supply of HF electricity. A drift of the amplifier due to elapsed time can also be eliminated. And, if anything is the matter with the power supplying means etc., it is recognized in its early stage from fluctuation in the HF electric power.

Particularly, the first HF power source of the invention functions as follows. For example, an input signal with a prescribed frequency is amplified by an amplifier 11 to become HF electricity and the power thereof is detected by the power detector 12.

In order to eliminate the power detection error caused by the power detector 12, the power correction value is subtracted from the detected-power data D11. The control target data from which the power detection error is removed is then compared with the set-power data Dth. In case the control target data is larger than the set-power data Dth, the amplifier 11 is adjusted so as to decrease its gain. On the contrary, in case the control target data is smaller than the set-power date Dth, the amplifier 11 is adjusted so as to increase its gain. The control gain data D12 can be obtained by multiplying the control target data by a certain parameter.

The state on the HF electric power detected by the power detector 12 is binary-converted into detected-power data D11. An operation is performed on the detected-power data D11, preset initial characteristic data DR and set-power data Dth yielding control gain data D12. The control gain data D12 is, for example, converted into an analog signal, which is output from the controller 13 to the amplifier 11.

In this case, reading the initial characteristic data DR from the memory 13A of the controller 13, the comparative operation section 13B derives control target data from the initial characteristic data DR and the detected-power data D11 and compares it with the set-power data Dth1 to yield the difference based thereon to compute control gain data D12.

Thus, the output of the amplifier 11 is automatically adjusted on the basis of the control gain data D12 so that individual difference of the power detector 12 can be settled.

Also, the comparative operation section 13B compares the control gain data D12 and the initial gain data DG. If the result is wide of the control target, the section 13B issues a warning signal SA1. This notifies that a drift of the power detector 12 has occurred, enabling the stable supply of HF electricity to the load and early maintenance as well. Variation in load may be seen beforehand from the fluctuation in the output of the amplifier 11.

Thus, the first HF power source of the invention enables improving reliability of a RF sputter apparatus, plasma CVD apparatus, dry etching apparatus, ashing apparatus, etc. to which the HF power source is applied.

Now, we discuss the operation of the second HF power source of the invention. For example, when HF electricity for plasma generation is detected by the power detector 14, a power detecting signal is binary-converted into detected-power data D21, which is supplied to the controller 16. And, the matching circuit 15 makes an impedance matching with respect to the HF electricity.

In this case, the controller 16 causes the comparative operation section 16B thereof to produce matching point data D22 from the detected-power data D21 and sends the matching point data D22 to the matching circuit 15. By doing this, the set position of the tuner in the matching circuit 15 is automatically controlled.

On normal occasion without fluctuation of the load, the tuner set position of the matching circuit 15 is detected in advance and the detected position data D23 is stored in the memory 16A of the controller 16. In ordinary operation of the HF power source, the detected position data D23 read from the memory 16A is operated by the comparative operation section 16B. In this operation, the subtraction between the detected position D23 and the matching position D22 makes a control target data, which is compared with the set-position data Dth2 by the comparative operation section 16B.

Thus, if the tuner set position of the matching circuit 15 which is acquired in ordinary operation is wide of the tuner set position of the matching circuit 15 which has been acquired in normal operation, a warning signal SA2 can be issued. That is, if the control target data exceeds the set-position data Dth2, the warning signal indicates that the load impedance has changed.

This enables early detection of fluctuation in the load impedance and supply of stable HF electricity to the load as in the first HF power source. It also makes it possible to notify the necessity of maintenance and to reduce useless power loss as is found in the related art of the invention.

We discuss the operation of the third HF power source in the following. For example, when impedance matching has been made by the matching circuit 17 with respect to the HF electricity, the output waveform of the matching circuit 17 is detected. This output waveform is binary-converted into detected-waveform data D31 which is stored in the memory 18A of the controller 18.

The detected-waveform data D31 is sampled and held by the comparative operation section 18B of the controller 18. The mean value and the standard deviation of peak voltages in the output waveform of the matching circuit 17 is calculated from the detected-waveform data D31 which is derived from at least three periods of the matching circuit 17 output.

When a change in the mean value or the standard deviation of peak voltages of the output signal of the matching circuit 17 exceeds a predetermined value, a warning signal SA3 is issued. That is, the warning signal SA3 indicates that the load impedance has changed, when a change in the mean value or the standard deviation of peak voltages exceeds a preset threshold data Dth3.

This enables early detection of fluctuation in the load impedance and supply of stable HF electricity to the load as in the second HF power source. It also makes it possible to notify the necessity of maintenance and to reduce useless power loss as is found in the related art of the invention.

We discuss the operation of the principle plasma generator in the following. For example, the power supplying means amplifies an HF signal to generate HF electricity, which is monitored by the output control means so that fluctuation in the HF electricity is held down. This results in plasma generation in the chamber based on stable HF electric power and semiconductor device processing with stable plasma.

Specifically, we discuss the operation of the first plasma generator. For example, the HF power supply 20 including one of first through third HF power sources of the invention supplies HF electricity to the electrodes 19 of the chamber.

According to the HF power supply 20, the HF electric power and the tuner set position of the matching circuit is automatically adjusted, so that individual difference and a drift of the power detector is settled and plasma can generated based on stable HF electric power. Also, the plasma density in the chamber can be maintained constant and the electric power loss other than electric power used for plasma can be reduced.

Thus, the growth rate, coverage, quality, etching rete and/or dimension selectively of a thin film can be stabilized.

Now, we discuss the operation of the second plasma generator of the invention. For example, an input signal with a prescribed frequency or a DC signal is amplified by the amplifier 21 to become microwave electricity, which is detected by the power detector 22. With respect to the microwave electricity, impedance matching is made by the matching circuit 23.

Thus, the control device 24 enables plasma generation based on stable HF electric power. Also, individual difference of the power detector 22 can be settled by automatically adjusting the output of the amplifier 21 on the basis of control gain data D42.

Further, the control gain data D42 and the initial gain data DG are compared. If the comparison result is wide of the control target, a warning signal SA4 is issued, which notifies that a drift of the power detector 22 has occurred and may notify the necessity of maintenance.

Therefore, the invention greatly contributes to the offer of a reliable plasma CVD apparatus, dry etching apparatus, ashing apparatus, etc.

Referring to the drawings, we explain illustrative embodiments of the invention in the following.

(1) Explanation of a First Preferred Embodiment

A first feature of the first embodiment is in that the power correction value (calibration data) which is suitable for the power detector 12 are prepared previously, and then, by subtracting the power correction value from the power detection value in practical use of the power source, the high frequency power can be output corresponding to the power detection value from which the power detection error caused by the power detector has been removed.

A second feature of the first embodiment is in that "upon adjusting the high frequency power according to the power detection value after individual difference being removed, it is informed by issuing the alarm that the gain characteristic of the amplifier is being varied owing to the variation in the load impedance if the gain adjusting value of the high frequency amplifier is out of the gain adjustable tolerance". Control system may often become uncontrollable due to large variation in a load impedance. Since this variation may be found in a early stage by the alarm of this embodiment, the control system can be prevented from entering an uncontrollable state at least due to the large variation in the load impedance.

Figure 7:
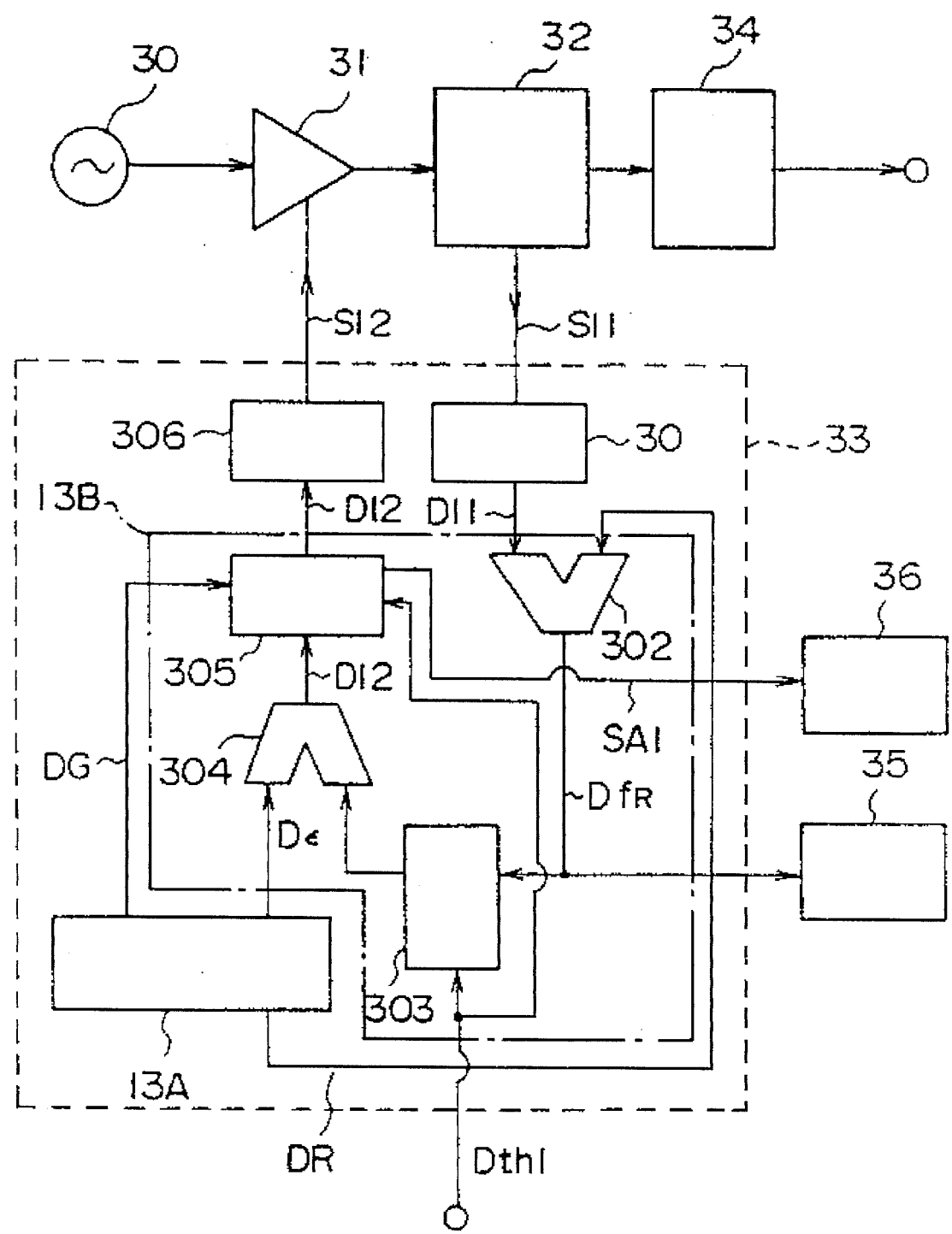
FIG. 7 is a diagram showing an arrangement of a high frequency power source for plasma generation according to a first preferred embodiment of the invention.

For example, in FIG. 7, a power source applicable to an HF power supply of a plasma generator is provided with a crystal oscillator 30, an HF amplifier 31, a power detector 32, a central processing unit (CPU) 33, a matching circuit 34, an output display circuit 35 and an alarm generator 36.

Particularly, the crystal oscillator 30 generates a sine signal with a frequency of 13.56 Mhz. The HF amplifier 31, which is an illustrative embodiment of the amplifier 11 of FIG. 2, amplifies the 13.56 Mhz sine signal. Unlike the related art of the invention, the amplification factor (gain) of the HF amplifier 31 is variable based on a control gain signal S12.

The power detector 32, which is an illustrative embodiment of the power detector 12 of FIG. 2, detects the state on the amplified HF electricity and supplies a detected power signal S11 to the CPU 33.

Figure 8:
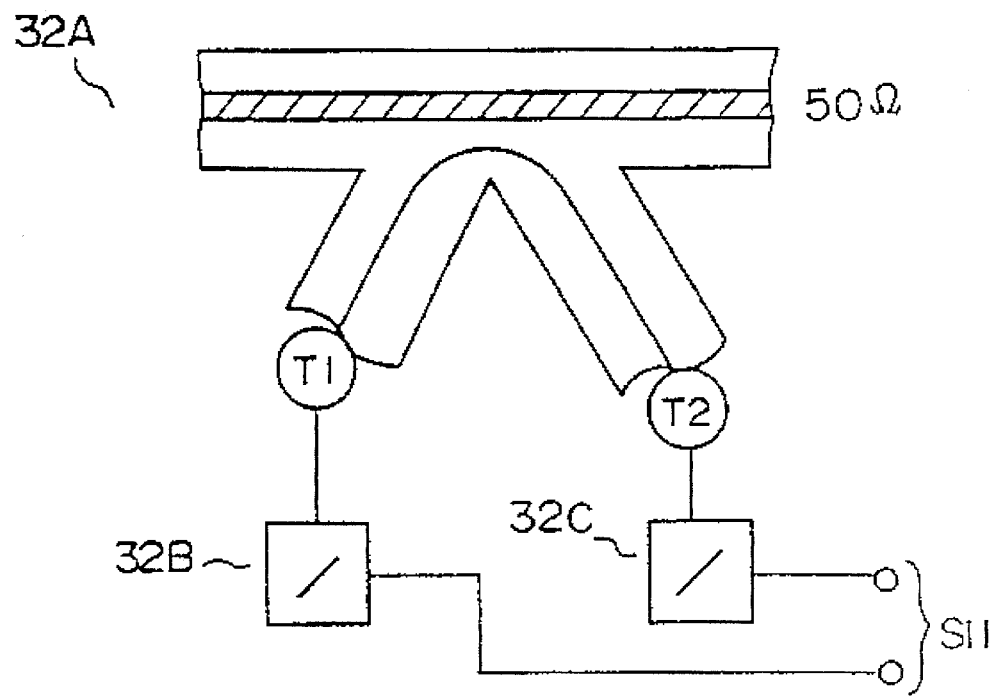
FIG. 8 is a diagram showing an arrangement of a power detector according to each embodiment of the invention.

As shown in FIG. 8, the power detector 32 comprises, for example, CM-type directional coupler 32A, power detecting meter 32B and 32C. The CM-type directional coupler 32A has a thermoelectric couple T1 and T2 and is connected to a coaxial cable of 50Ω for transmitting HF electricity. The power detecting meters 32B and 32C indicate an incident wave and a reflected wave, respectively.

The CPU 33, which is an illustrative embodiment of the controller 13, includes an A/D converter 301, RAM (random access memory) 13A and a comparative operation section 13B and D/A converter 306. The A/D converter 301 converts the detected power signal S11 into detected-power data D11, which is sent to the comparative operation section 13B.

The RAM 13A, which is an illustrative embodiment of the memory 13A of FIG. 2, stores the initial gain data DG and the initial characteristic data DR. The initial gain data DG is data indicating the initial gain Go(D) of the HF amplifier 31.

The initial gain data DG provide the upper limit value and the lower limit value both defining the gain adjustable range of the amplifier 11. The initial characteristic data DR have been derive previously from the actual measurement effected by the inventors or the present invention.

Figure 10A:
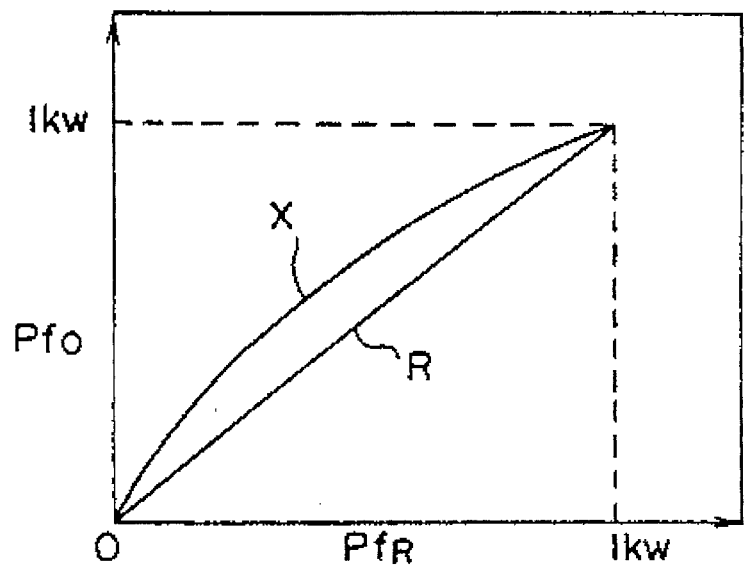
FIG. 10A is a diagram showing a relationship between a detected amount of electric power and a value of the true HF electric power which illustrates a function of a CPU of the HF power source shown in FIG. 7.

The initial characteristic data DR is data representative of the relation between a value R of the true HF power as shown in FIG. 10A and the detected power signal S11 of the power detector 32. It is noted that in FIG. 10A, the axis of ordinates indicates the detected power amount Pfo of the power detector 32, and the axis of abscissas indicates a value $Pf_R$ of the true HF electric power. The initial characteristic data DR are values used to eliminate the power detection error (individual difference) of the power detector 12, and serve as the power correction values. The power correction values can be obtained by approximating to the measured power detection error of the power detector 12 in terms of numerical analysis. R is a characteristic indicative of the relation between the true HF power and the detected power value. X is a characteristic indicative of the relation between the HF power transmitted to the coaxial cable and the detected power signal S11 of the power detector 32.

The comparative operation section 13B includes computing circuit 302 and 304 and comparators 303 and 305. The control target data is obtained by subtracting the power correction value from the detected-power data D11. The computing circuit 302 yields control target data $Df_R$ from the initial characteristic data DR and the detected power data D11. For example, the computing circuit 302 subtract a correction data from the detected power data D11 to output the control target data $Df_R$.

Figure 10B:
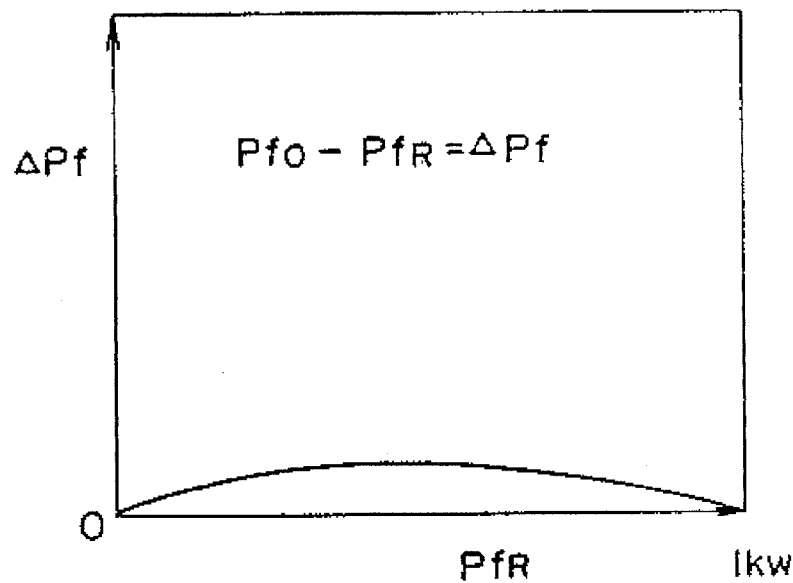
FIG. 10B is a diagram showing a relationship between a calibration amount of electric power and a value of the true HF electric power which illustrates a function of a CPU of the HF power source shown in FIG. 7.

Here, the detected power data D11 indicates the HF electric power Pfo transmitted to the coaxial cable, the correction data indicates the calibration amount $\Delta Pf$, the control target data $Df_R$ indicates the true HF power $Pf_R$. The relation between the calibration amount $\Delta Pf$ and the true HF power $Pf_R$ is shown in FIG. 10B.

The comparator 303 compares the true HF power $Pf_R$ and set-power data Dth1 to supply the comparison result data De to the computing circuit 304. The control target data Df is a value obtained by subtracting the power correction value from the detected-power data D11. The set-power data Dth1 is a set value used when the power is supplied to the load. The comparison result data DE is the control target value. The set-power data Dth1 indicates a set power value $P_R$ and is set from the outside. The computing circuit 304 computes a control gain data D12 from the comparison result data De to send it to the comparator 305. The control gain data D12 is a gain adjusting value which can be obtained by multiplying the control target value by the parameter 1/D. Where D is a power control value. The control gain data D12 is a value used to control the gain of the amplifier 11.

The comparator 305 compares the control gain data D12 and the initial gain data DG to generate a warning signal SA1. The initial gain data DG provide the upper limit value and the lower limit value both indicating the gain adjustable range of the amplifier 11. The control gained data D12 can be obtained by multiplying the control target value by the parameter 1/D, and serves as the gain adjusting value.

The warning SA1 is issued in case the gain adjusting value is in excess of the upper limit value or the lower limit value of the gain adjustable tolerance. The D/A converter 301 converts the control gain data D12 into the control gain signal S12 to send it to the HF amplifier 31.

Thus, the CPU 33 can obtain the control gain data D12 from the detected-power data D11, the initial characteristic data DR and the set-power data Dth1 to control the output of the HF amplifier 31 on the basis of the control gain data D12.

The matching circuit 34 is intended to match impedance between the power source and the load with respect to the frequency of the HF electricity. For example, in FIG. 9, the matching circuit 34 comprises a coil L, a coupling capacitor C and variable capacitor VC1 and VC2. In a preferred embodiment of the invention, the matching circuit is also provided with motors M1 and M2 for driving the variable capacitors VC1 and VC2, and encoders E1 and E2 for detecting a set position of the tuner.

The output display circuit 35 displays the true HF electric power $Pf_R$ based on control target data $Df_R$. The alarm generator 36 generates an alarm on the basis of a warning signal SA1.

Figure 11:
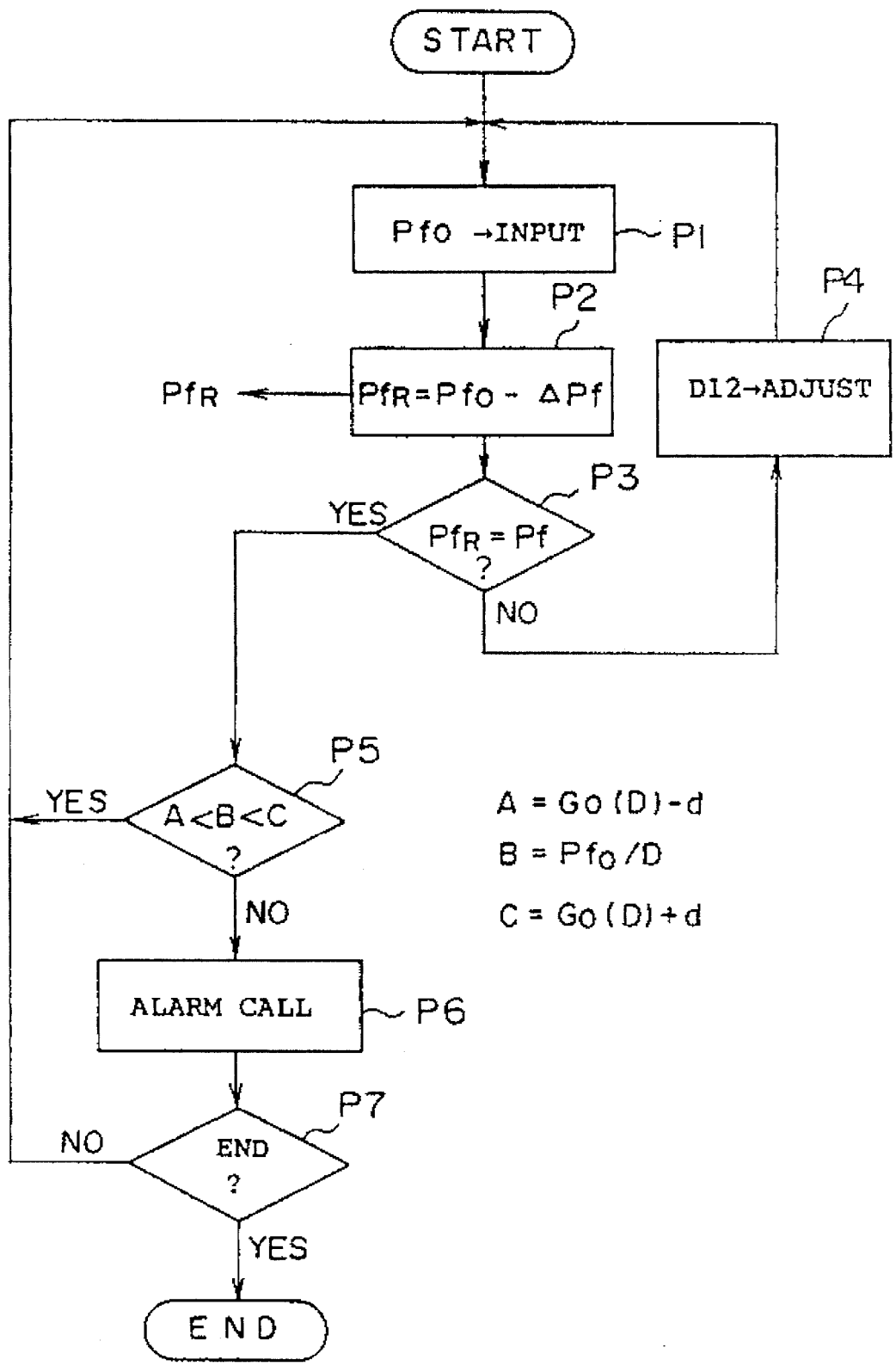
FIG. 11 is a control flow chart of the CPU of the HF power source shown in FIG. 7.

Referring to FIG. 7 and 11, we discuss the operation of the HF power source of the present embodiment in the following. In FIG. 7, for example, a 13.56 Mhz sine signal is amplified by an amplifier 31 to become HF electricity the power of which, Pfo, is detected by a power detector 32 to be made a detected power signal S11, which is binary-converted by an A/D converter 301.

Figure 10C:
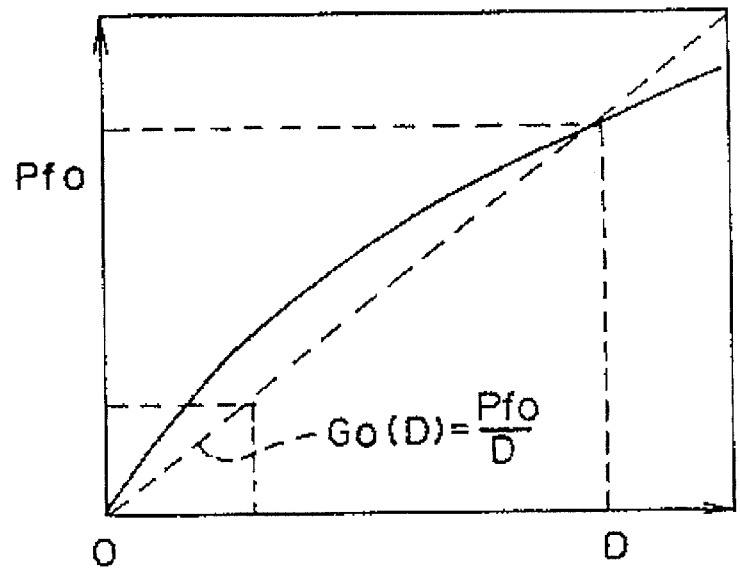
FIG. 10C is a diagram showing a relationship between a detected amount of electric power and a controlled value of electric power which illustrates a function of a CPU of the HF power source shown in FIG. 7.

Now, we assume the HF electric power Pfo to have a characteristic with respect to the power controlling value D as shown in FIG. 10C. In FIG. 10C, the axis of abscissas indicates the power controlling value D for controlling the HF power Pfo, and the axis of ordinates indicates the HF power Pfo detected by the power detector 32.

In a flow chart of the CPU control shown in FIG. 11, CPU 33 first reads the HF power Pfo at step P1. Concretely, the detected power signal S11 is converted into binary detected-power data D11, which is sent to the comparative operation section 13B.

Next, at step P2, the CPU 33 computes the true HF power $Pf_R=Pfo-\Delta Pf$. At this time, the initial characteristic data DR is read from the memory 13A. The computing circuit 302 computes the control target data $Df_R$ from the initial characteristic data DR and the detected-power data D11.

The control target data Df is the value which can be obtained by subtracting the power correction value from the power detection data D11.

Then, at step P3, the CPU 33 determines whether the true HF power $Pf_R$ and the set power value $P_f$ are equal. If the power $Pf_R$ is not equal to the set power value $P_f$ (NO), the CPU 33 proceeds to step P4 to adjust the control gain data D12. Specifically, the comparator 303 compares the set power data Dth1 and the control target data $Df_R$ and the computing circuit 304 computes the control gain data D12 on the basis of the compared result. The comparison result data DE is utilized as the control target value. The control gain data D12 is the value obtained by multiplying the control target value by the parameter 1/D, and serves as the gain adjusting value. The control gain data D12 is the value to adjust the gain of the amplifier 11. On the other hand, if the power $Pf_R$ accords with the set power value $P_f$ at step P3 (YES), the CPU 33 proceeds to step P5.

At step P5, the CPU 33 tests to see whether is wide of the initial gain of the HF amplifier 31 by means of an expression $$Go(D)-d<Pfo/D<Go(D)+d,$$

where A=Go(D)-d is the lowest limit of gain, C=Go(D)+d is the highest limit of gain, and B=Pfo/D is the gain of HF amplifier 31 in case of supplying HF power Pfo, where Go(D) is an initial gain and D is a power controlling value depending on the control gain signal S11. The initial gain data DG provides the upper limit value and the lower limit value both defining the gain adjustable range of the amplifier 11.

If the expression is true (YES), it means that the difference from the initial gain is not significant, so the CPU 33 bypasses step P6 (alarm call) and goes directly to step P7. Otherwise (NO), since the difference from the initial gain is significant, the CPU 33 proceeds to step P6.

At step P6, the CPU 33 executes an alarm call. Concretely, the comparative operation section 13B compares the control gain data D12 and the initial gain data DG. If the comparison result is wide of the control target, a warning signal SA1 is issued to an alarm generator 36. The warning signal SA1 is issued in case the gain adjusting value exceeds the upper limit value or the lower limit value of the gain adjustable range.

Subsequently, if the CPU 33 is to terminate the processing at step P7 (YES), it ends with an plasma OFF signal. Otherwise (NO), it goes back to step P1 to read the HF power Pfo.

As described above, an HF power source according to a first preferred embodiment of the invention, as shown in FIG. 7, is provided with a CPU 33 obtaining control gain data D12 from detected-power data D11 and preset initial characteristic data DR for controlling the output of the HF amplifier on the basis of the control gain data D12.

Thus, individual difference of the power detector 32 is settled by automatically controlling the output of the HF amplifier 31 on the basis of the control gain signal S12. Individual difference of the power detector 32 can be eliminated if the power correction value is subtracted from the detected power data D11.

Further, the control gain data D12 and the initial gain data DG are compared by the comparative operation section 13B. If the comparison result is wide of the control target, a warning signal SA1 is issued to the alarm generator 36.

Thus, it is notified that a drift of the power detector 22 has occurred, which enables the stable supply of HF electric power. And, the necessity of maintenance can be notified. The variation in load may be foreseen from the fluctuation in the output of the amplifier 11.

Therefore, there is provided an HF power source wherein an error correction function and a drift monitoring function of the power detector 32 are improved. It is also possible to enhance the reliability of a plasma CVD apparatus, dry etching apparatus, ashing apparatus, etc. to which an HF power source of the invention is applied.

(2) Explanation of a Second Preferred Embodiment

A feature of the second embodiment is in that "the relation between the power supply value and the tuning position of the matching circuit to minimize the reflected wave between them is first detected previously while the load operates normally, i.e., before the power source is practically used, then a displacement in tuning position is detected on the basis of the previously detected relation between the power supply value and the tuning position at the time when the power source is actually being used, and then it is informed by generating the alarm that the load is being varied if the displacement in tuning position exceeds the threshold value". Since the variation in the load impedance is found in an early stage by the alarm, control system can be prevented from entering an uncontrollable state at least due to the large displacement in the tuning position.

The second preferred embodiment, unlike the first preferred embodiment, is provided with a CPU 44 for controlling the output of a matching circuit 43 on the basis of matching position data D22.

Figure 12:
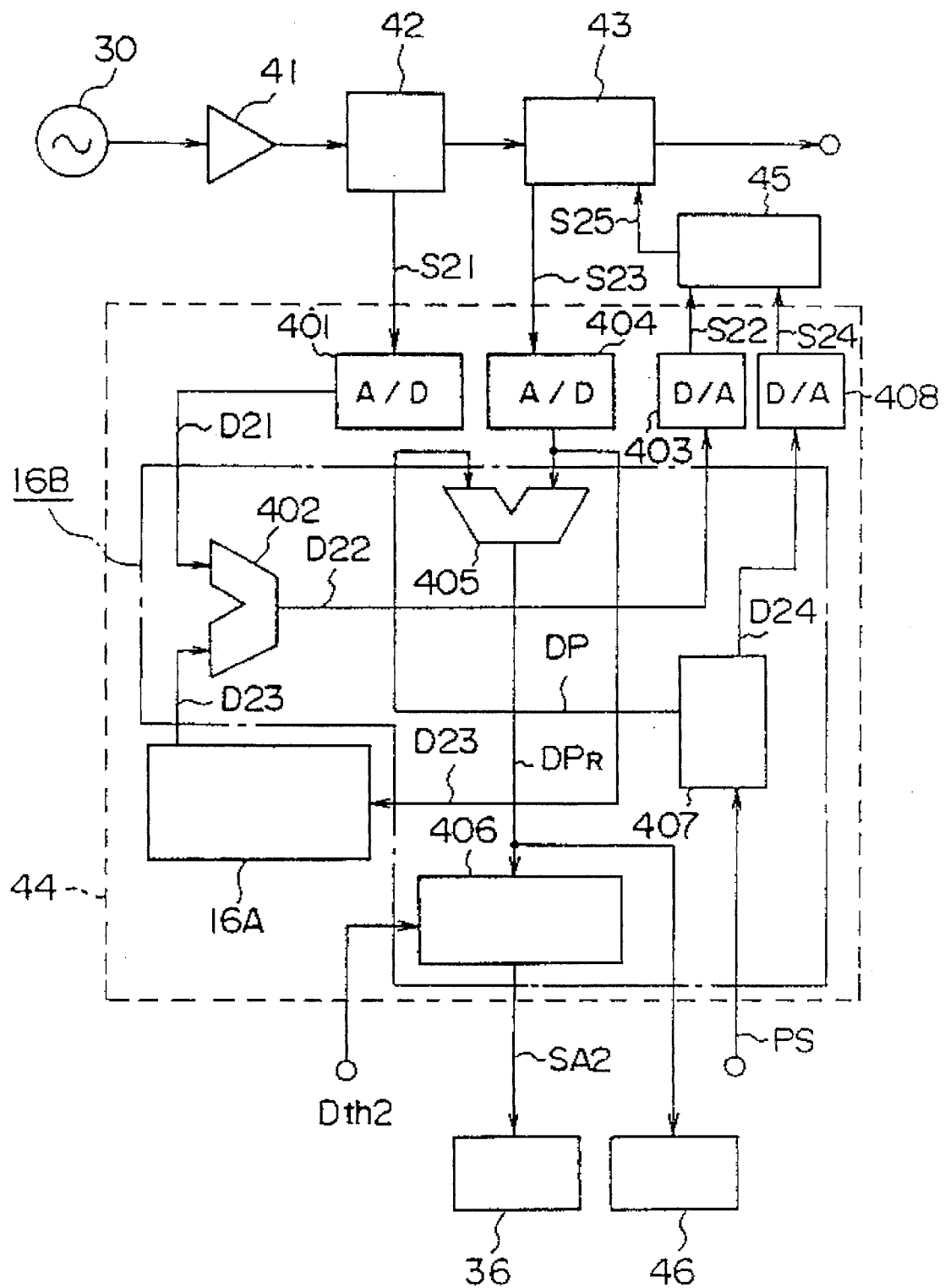
FIG. 12 is a diagram showing an arrangement of a high frequency power source according to a second preferred embodiment of the invention.

In FIG.12, a second HF power source of the invention comprises a crystal oscillator 30, an alarm generator 36, an HF amplifier 41, a power detector 42, a matching circuit 43, a CPU 44, a driver 45 and a position display circuit 46.

The power detector 42, which is an illustrative embodiment of the power detector 14 of FIG. 3, detects state on HF electricity to send a detected power signal S21 to the CPU 44. The matching circuit 43, which is an illustrative embodiment of the matching circuit 15, is provided with motors M1 and M2 for driving variable capacitors VC1 and VC2, and encoders E1 and E2 for detecting the tuner set position, inputs and outputs of which is automatically controlled to make impedance matching with respect to the HF electricity.

The CPU 44, which is an illustrative embodiment of the controller 16, comprises A/D converters 401 and 404, RAM 16A, a comparative operation section 16B and D/A converters 403 and 408. The A/D converter 401 converts a detected power signal S21 into binary detected power data D21 to supply it to the comparative operation section 16B. The A/D converter 404 converts a detected position signal S23 into binary detected position data D23 to supply it to the comparative operation section 16B. The RAM, which is an illustrative embodiment of the memory 16A of FIG. 3, stores detected position data D23 indicative of the tuner set position.

The comparative operation section 16B comprises computing circuits 402 and 405, a preset computing circuit 407 and a comparator 406. The computing circuit 402 computes a matching position data D22 from the detected power data D21 and the detected position data D23 and send the matching position data D22 to the D/A converter 403. The D/A converter 403 converts the matching position data D22 into a matching position signal S22 to send it to the driver 45.

The computing circuit 405 computes control target data $DP_R$ or the difference between initial position data DP and detected position data D23, and sends this control target data $DP_R$ to the comparator 406. The preset computing circuit 407 Generates motor driving data D24 and initial position data DP on the basis of a preset data PS to send the data D24 to the D/A converter 408. The D/A converter 408 converts digital data D24 into analog motor control signal S24 to send it to the driver 45. Also, the preset computing circuit 407 sends the data DP to the computing circuit 405. The comparator 406 compares the control target data $DP_R$ and the set-position data Dth2 to Generate a warning signal DA2 to send it to the alarm Generator 36.

Thus, deriving the matching position data D22 from the detected-power data D21, the CPU 44 can control the output of the matching circuit 43 based on the matching position data D22.

The driver 45 Generates the motor driving signal S25 from the matching position signal S22 and the motor control signal S24 to supply the motor driving signal S25 to the motors M1 and M2 for driving respective variable capacitors VC1 and VC2. The position display circuit 46 displays the set position of the tuner on the basis of the control target data $DP_R$. The crystal oscillator 30, the alarm generator 36 and the HF amplifier 41 has the same functions as those in the first embodiment, their explanation will be omitted.

Figure 9:
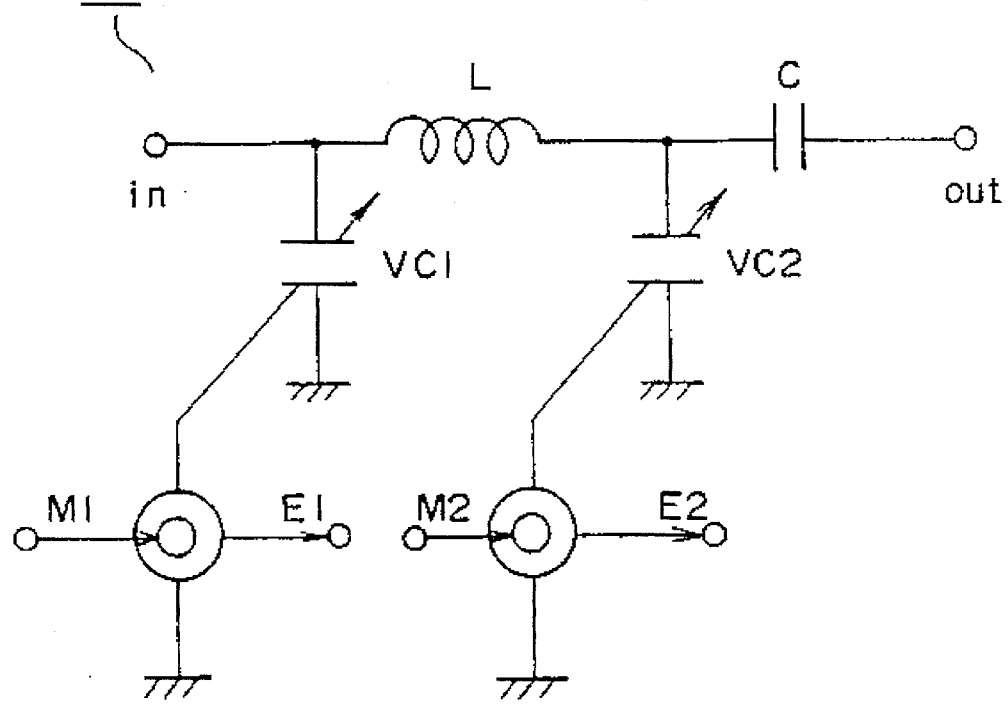
FIG. 9 is a diagram showing an arrangement of a matching circuit according to each embodiment of the invention.
Figure 13:
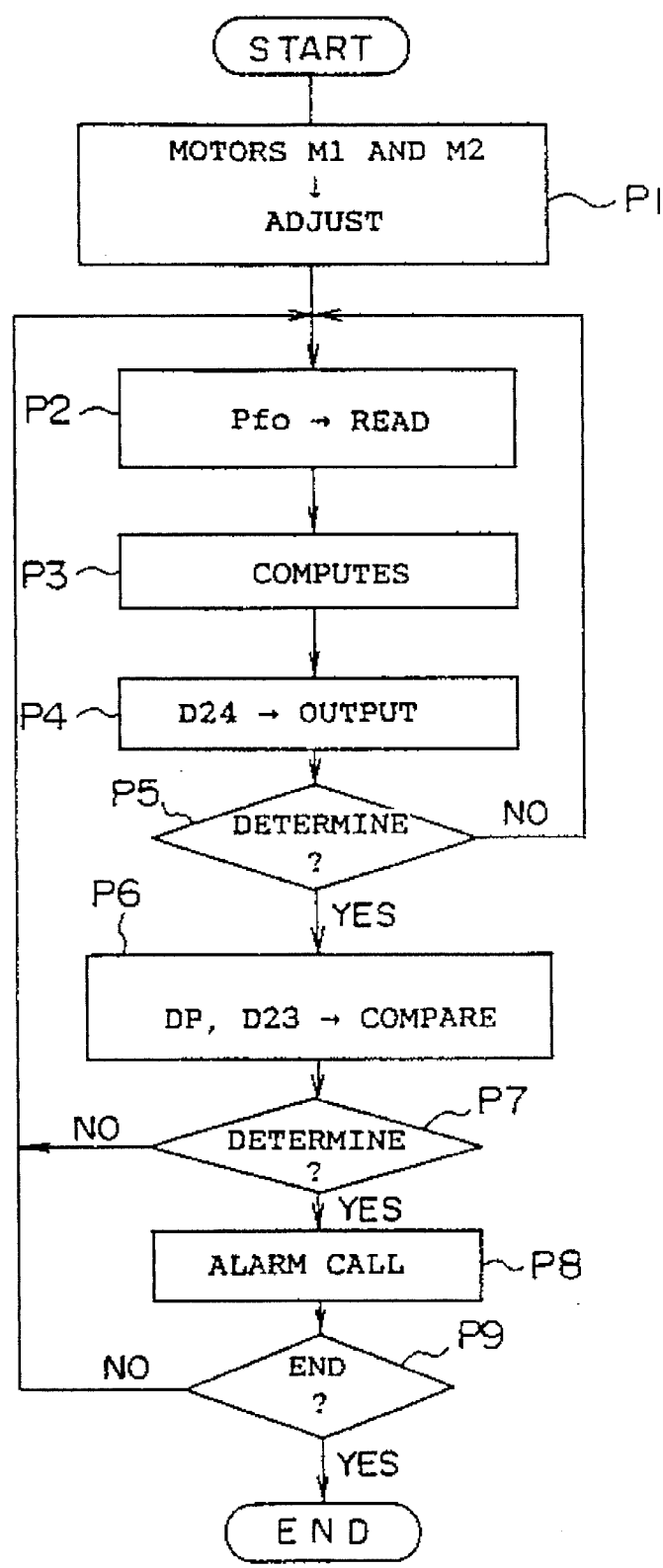
FIG. 13 is a control flow chart of the CPU of the HF power source shown in FIG. 12.

Now, referring to the CPU control flow chart shown in FIG. 13, we discuss the operation of the HF power source of the present embodiment. For example, as shown in the flow chart of FIG. 13, at step P1, the CPU adjusts the motors M1 and M2 so as to make the set-position of the tuner the preset position. Concretely, the variable capacitors VC1 and VC2 of the matching circuit 43 as shown in FIG. 9 is driven by the motor M1 and M2. In this case, the HF power source is in a state without load.

At step P2, the CPU 44 reads the HF electric power Pfo. Then, the HF electric power is supplied to the load. And, the power detector 42 detects the power to send the detected power signal S21 to the CPU 44. The A/D converter 401 converts the analog detected power signal S21 into the binary detected-power data D21 to send it to the computing circuit 402.

At step P3, the CPU 44 computes the matching position of the tuner. That is, The CPU detects the tuner set-position of the matching circuit 43 at a time of normal operation during which the load does not change and sends the detected set-point signal S23 to the A/D converter 404, where the analog signal S23 is converted into digital detected position data D23, which is stored in the memory 16A.

The computation of the matching point is executed by the computing circuit 402. For example, The computing circuit 402 derives matching point data D22 from the detected power data D21 and the detected position data D23 to send the matching point data D22 to the D/A converter 403, where the digital data D22 is converted into an analog matching point signal S22, which is sent to the driver 45.

At step P4, the motor control data D24 is sent to the D/A converter 408. Concretely, on the basis of a preset data PS, the preset computing circuit 407 sends the motor driving data D24 to the D/A converter 408, permitting the tuner set-position of the matching circuit 408 to be automatically adjusted.

At step P5, the CPU 44 determines whether the reflected wave is minimum or not. If so (YES), it returns to step P2 and reads the HF electric power Pfo. Otherwise (NO), the CPU 44 proceeds to step P6.

At step 6, the preset position and the matching point are compared. Here, the computing circuit 405 performs operations on the initial position data DP from the preset computing circuit 407 and the detected position data D23. The operations in this case comprises the subtraction between the initial position data DP and the detected position data D23 and the correction thereof to yield control target data $DP_R$ which is derived from the correction of the difference data. The control target data $DP_R$ is compared by the comparator 406 with the set-position data Dth2 and displayed by the position display circuit 46.

At step P7, the CPU 44 determines whether the difference between the preset position and the matching point is large or not, and if so (YES), it proceeds to step P8. Otherwise (NO), it bypasses to step P8 and proceeds to step P9.

At step P8, the CPU executes an alarm call. This state is such that the tuner set-position of the matching circuit 43 which is obtained in ordinary operation is wide of the tuner set-position of the matching circuit 43 which has been obtained in normal operation. Concretely, the comparator 406 issues a warning signal SA2 to the alarm generator 36. When the control target data $Df_R$ exceeds the set-position data Dth2, the warning signal SA2 indicates that the impedance of the load has changed.

Next, at step P9, the CPU determines whether to end the processing. If it does (YES), it ends with a plasma OFF signal. Otherwise (NO), the CPU 44 returns to step P2, where it reads the HF electric power Pfo.

As described in connection with FIG. 12, an HF power source in accordance with a second preferred embodiment of the invention is provided with a CPU 44 deriving matching position data D22 from detected power data D21 for controlling the set position of the matching circuit 43 on the basis of the matching position data D22.

Thus, when the tuner set-position of the matching circuit 43 which is obtained in ordinary operation is wide of the tuner set-position of the matching circuit 43 which has been obtained in normal operation, a warning signal SA2 is issued, so that it can be recognized that the impedance of the load has been changed.

Therefore, there is provided an HF power source wherein a set-position detecting function and an error correction function of variable capacitors of the matching circuit 43 are improved. This enables the early detection of fluctuation in the load impedance and accordingly the stable supply of HF electric power as in case of the first embodiment.

It also makes it possible to notify the necessity of maintenance and to reduce undesirable power loss as is found in the related art of the invention. And, as is the case with the first embodiment, it is also possible to enhance the reliability of a plasma generator to which an HF power source of the invention is applied.

(3) Explanation of a Third Preferred Embodiment

A feature of the third embodiment is in that "first the output voltage waveform from the high frequency amplifier is measured to calculate a mean value or a standard deviation of the output voltage, then it is informed by generating the alarm that the load is being varied if the mean value or the standard deviation exceeds the previously set threshold value". Since the variation in the load impedance is found in an early stage by the alarm, control system can be prevented from entering an uncontrollable state at least due to the large distortion in the output voltage waveform.

Figure 14:
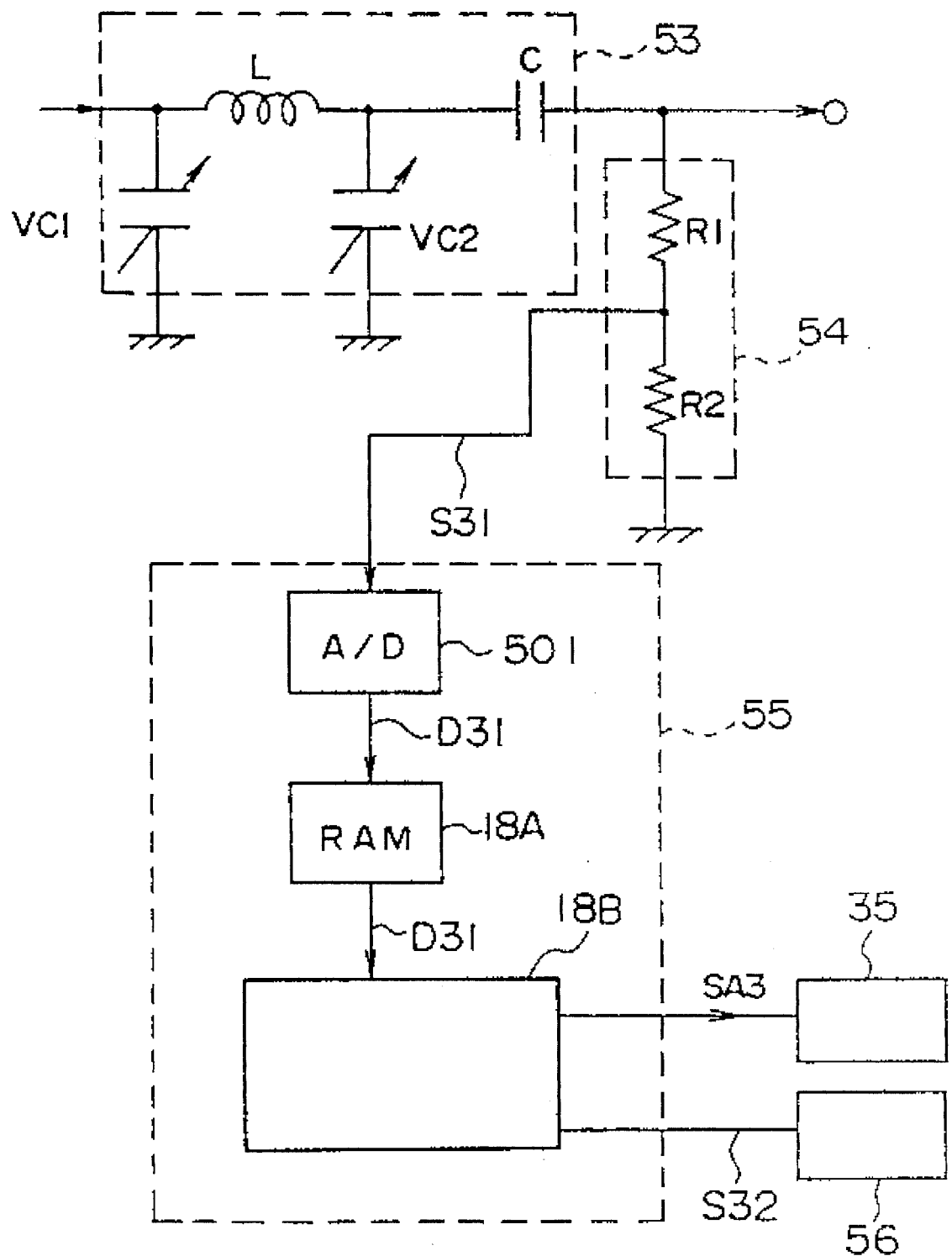
FIG. 14 is a diagram showing an arrangement of a high frequency power source according to a third preferred embodiment of the invention.

Unlike the first and the second preferred embodiment, a third preferred embodiment is provided with a CPU 55 which detects fluctuation in the impedance of the load from the output waveform of a matching circuit 53. In FIG. 14, a third HF power source of the invention comprises an alarm generator 56, a matching circuit 53, a voltage dropper 54, a CPU 55 and a data display circuit 46.

Specifically, the matching circuit 53 is an illustrative embodiment of the matching circuit 17 of FIG. 2 and intended for making impedance matching with respect to HF electricity. The matching circuit 53 may be either of a manual adjusting type such as is used in the related art of the invention or of an automatic adjusting mechanism.

The voltage dropper 54 comprises two serially connected resistors R1 and R2. The voltage dropper 54 connects the output side of the coupling capacitor C in the matching circuit 53 and the ground. The CPU 55 monitors the output signal (output waveform) appearing at the coupling point of the resistors R1 and R2.

The CPU 55 is an illustrative embodiment of the controller 18 and comprises an A/D converter 501, RAM 18A and a comparative operation section 18B. The A/D converter 501 converts the output signal S31 derived from the coupling point of the resistors R1 and R2 into digital output data D31 to send them to RAM 18A, where they are stored as detected waveform data D31.

The comparative operation section 18B samples and holds the detected waveform data D31 in the memory 18A to calculate the mean value and the standard deviation of peak voltages of the output waveform of the matching circuit 53 from the held detected-waveform data D31. Also, the comparative operation section 18B generates a warning signal SA3 when a change in the mean value or the standard deviation of peak voltages of the output waveform of the matching circuit 53 exceeds a preset threshold data Dth3.

Thus, the CPU 55 can monitor the fluctuation in the impedance of the load by using the output waveform of the matching circuit 53. Further, The data display circuit 35 displays the mean value and the standard deviation of peak voltages of the output waveform of the matching circuit 53 according to a display control signal S32.

Now, we discuss the operation of the HF power source of the present embodiment. The output waveform of the matching circuit 53 is detected after impedance matching is made with respect to the frequency of the HF electricity. The detected output waveform signal S31 is converted by the A/D converter into binary detected waveform data D31, which is stored in the memory 18A of the CPU 55.

The detected waveform data D31 is sampled and held by the comparative operation section 18B. In this case, at least 3 period of the data D31 is held. The comparative operation section 18B calculates the mean value and the standard deviation of peak voltages of the output waveform of the matching circuit 53 from the held detected-waveform data D31.

Also, the comparative operation section 18B generates a warning signal SA3 when a change in the mean value or the standard deviation of peak voltages of the output waveform of the matching circuit 53 exceeds a preset threshold data Dth3. Thus, the CPU 55 controls the constancy and fluctuation in the oscillation voltage.

As described in connection with FIG. 14, an HF power source according to the third preferred embodiment of the invention is provided with a CPU 55 which samples and holds the output waveform of the matching circuit 53, binary-converts held waveform into digital detected-waveform data D31, and therefrom calculates the mean value and the standard deviation of peak voltage of the output waveform of the matching circuit 53.

When a change in the mean value or the standard deviation of peak voltages of the output signal of the matching circuit 17 exceeds a predetermined value, a warning signal SA3 is issued. That makes it possible to recognize that the load impedance has changed.

This enables early detection of fluctuation in the load impedance and supply of stable HF electricity to the load as in the second preferred embodiment. Also, the invention makes it possible to notify the necessity of maintenance and to reduce undesirable power loss as is found in the related art of the invention. And, as is the case with the first and second embodiment, it is also possible to enhance the reliability of a plasma generator to which the present HF power source of the invention is applied.

(4) Explanation of Exemplary Applications of Each Embodiment

Figure 15:
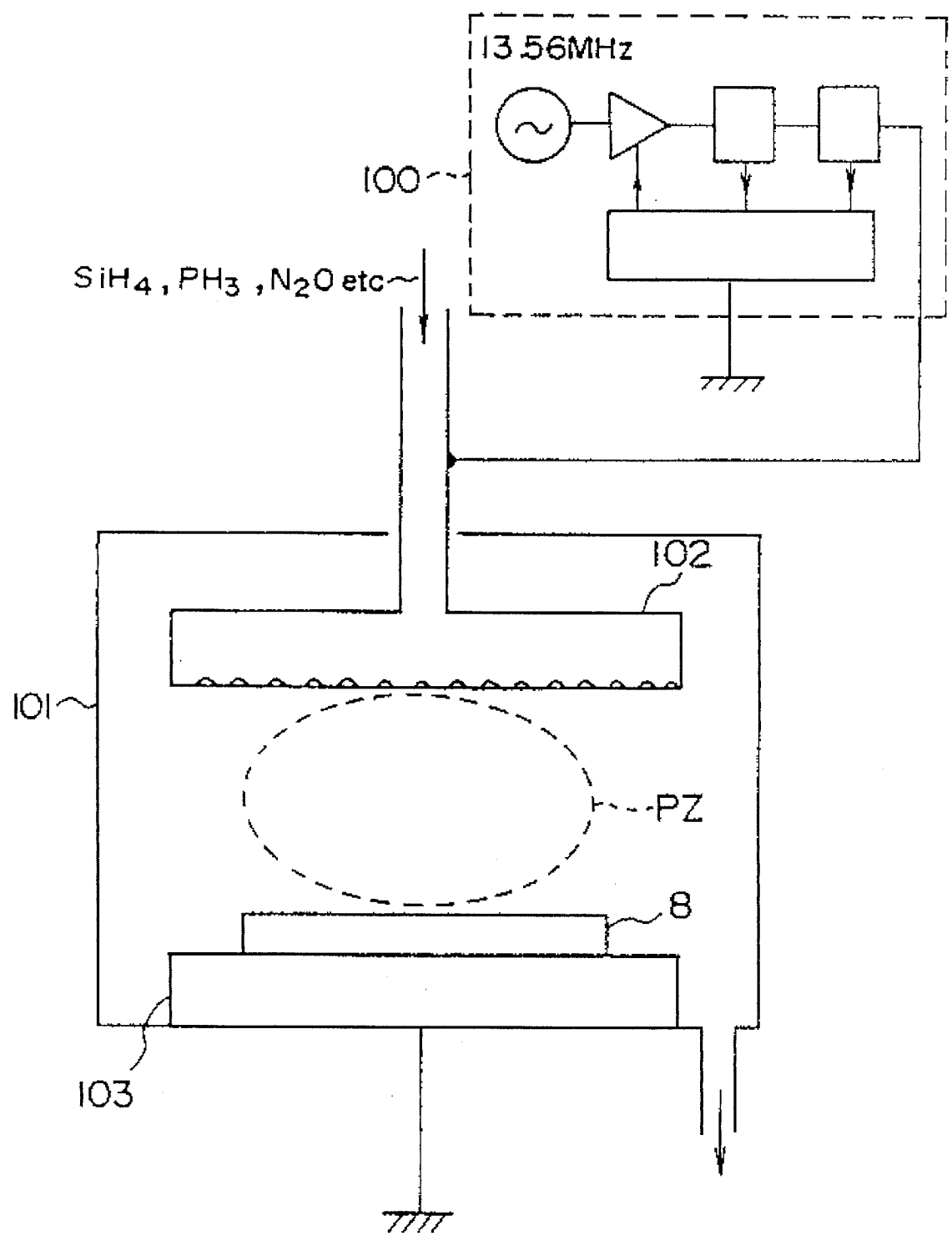
FIG. 15 is a diagram showing an arrangement of a preferred plasma CVD apparatus to which an HF power source according to each embodiment of the invention is applied.

For example, a RF plasma CVD apparatus for growing an $SiO_2$ film on a semiconductor wafer comprises an HF power supply 100, a vacuum chamber 101, an electrode 102, and a combination heater and electrode 103 as shown in FIG. 15.

Specifically, the HF power supply 100 is an example of the HF power supply 20 in FIG. 5 and is the one for supplying HF electricity to the electrode 102. The HF power supply 100 includes HF power sources of the first through third preferred embodiments of the invention. The combination of the embodiments is left to the designer's option. It is most preferable to provide the three functions.

The electrode 102 is provided within the vacuum chamber 101 and is a shower-like structure for introducing and blowing out such reaction gas as $SiO_2$, $PH_3$, $NO_2$, etc. The combination heater and electrode 103 is also used as a suscepter on which a wafer 8 is set.

The RF plasma CVD apparatus functions as follows. For example, when HF electricity is supplied from the HF power supply 100 to the electrode 102 and the combination heater and electrode 103, plasma PZ is generated between the two electrodes 102 and 103. During the operation, the HF electric power and/or the set point of the tuner are automatically controlled.

As described in connection with FIG. 15, the plasma CVD apparatus of the invention includes HF power sources according to the first through third preferred embodiments of the invention.

Since the HF electric power and/or the set point of the tuner are automatically controlled, individual difference and a drift of the power detector is settled enabling plasma generation based on stable HF electric power.

Now, we compare a plasma generator according to each preferred embodiment of the invention with a plasma generator according to the related art of the invention. In depositing an $SiO_2$ film on a semiconductor wafer, as the film deposition conditions we made $SiH_4$ at 20 sccm, $O_2$ at 50 sccm, $N_2$ at 300 sccm, the degree of vacuum at 0.5 torr, the wafer temperature at 400° C., HF power and its frequency at 50 watts and at 13.56 Mhz, respectively. From the comparison between a wafer processed with the related art of the invention and one processed with a preferred embodiment of the invention, we found that the fluctuation in the former and the latter film thickness was 8% and less than 2%, respectively, resulting in a decrease in thickness fluctuation.

This is because net HF power supplied to plasma has been further stabilized as compared with the related art of the invention. Abnormalities in the quality and the thickness of a film, which tends to be considered to be caused by abnormality in the flow of $SiH_4$, was able to be taken as abnormality in the set positions of the variable capacitors. Because though the related art of the invention has a problem that the set position of the variable capacitors can not be detected, it was solved by using a matching circuit 43 according to the first preferred embodiment.

Thus, the plasma density in the chamber can be maintained constant and the electric power loss other than electric power used for plasma PZ can be reduced. Also, the growth rate, coverage, quality, etching rate and/or dimension selectively of a thin film can be stabilized. These greatly contribute to the offer of a reliable RF plasma CVD apparatus.

Figure 16:
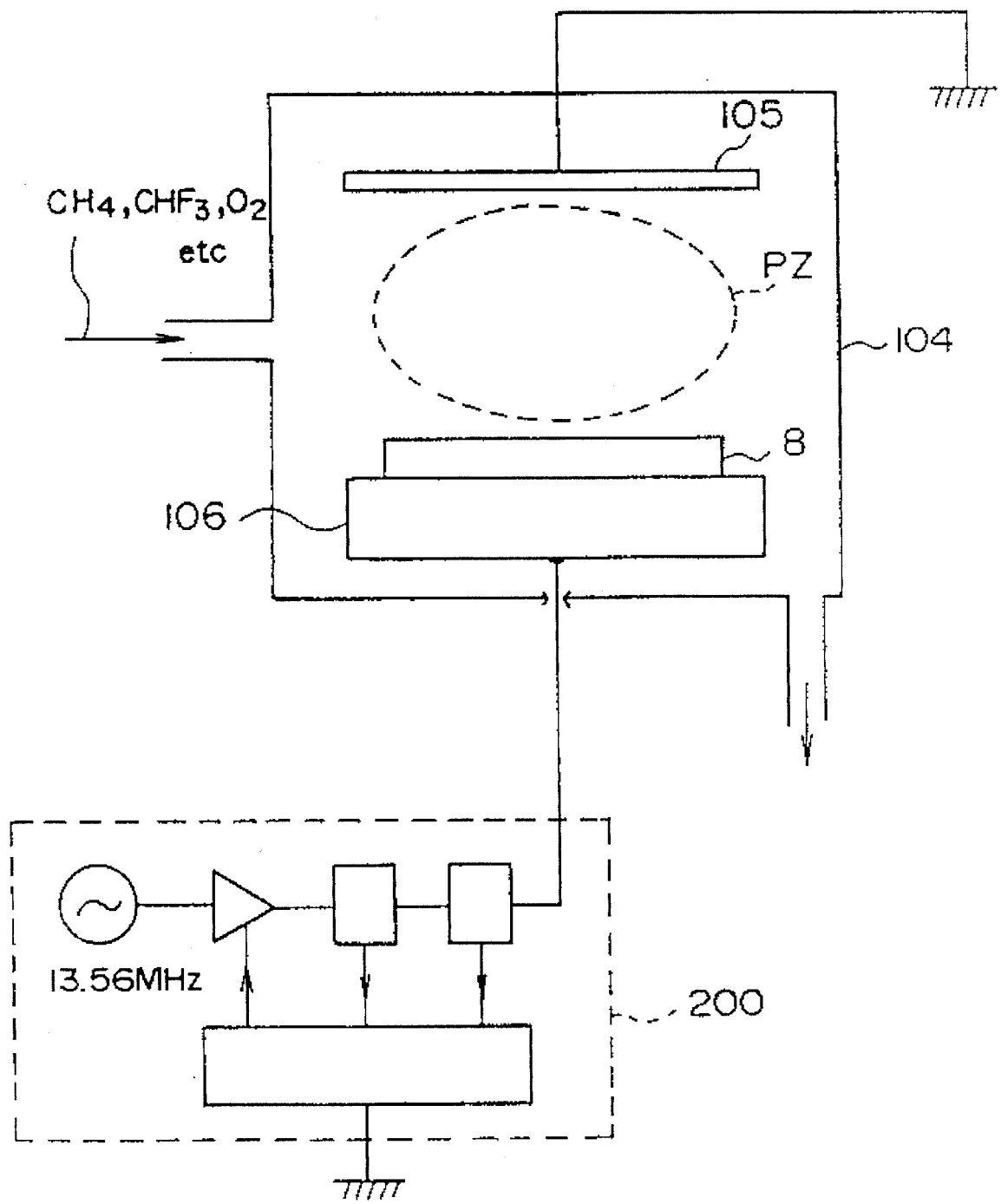
FIG. 16 is a diagram showing an arrangement of a preferred dry etching apparatus to which an HF power source according to each embodiment of the invention is applied.

FIG. 16 shows the structure of a dry etching apparatus to which an HF power supply according to each embodiment of the invention is applied. A dry etching apparatus for removing the film on a semiconductor wafer 8 comprises, for example, an HF power supply 200, a vacuum chamber 104, a cathode electrode 105 and a combination heater and electrode 106 as shown in FIG. 16.

Specifically, the HF power supply is an example of an HF power source 20 of FIG. 5 and supplies HF power to the electrode 108. The HF power supply 200 includes HF power sources of the first through third preferred embodiment of the invention. The combination is left to the designer's option as in case of a RF plasma CVD apparatus. It is most preferable to provide the three functions.

The cathode electrode 105 is provided in a vacuum chamber 104 and is connected to the ground. Reaction gases $SiH_4$, $CHF_3$, $O_2$, etc. are introduced into the vacuum chamber 104. The combination heater and electrode 106 is also used as a suscepter on which a semiconductor wafer is set.

Next, we discuss the operation of the dry etching apparatus. For example, when HF power is supplied from the HF power supply 200 to the cathode electrode 105 and the combination heater and electrode 106 in the chamber, plasma PZ is generated between the electrodes 105 and 106. During the operation, the set position of the tuner in the matching circuit is automatically adjusted.

As described in conjunction with FIG. 16, according to a dry etching apparatus of the invention, an HF power supply 200 includes one or more HF power sources according to the first through third preferred embodiment of the invention.

Therefore, since the HF power supply automatically adjusts the HF power and/or the tuner set position of the matching circuit, individual difference and a drift of the power detector is settled enabling the generation of plasma PZ based on stable HF electric power.

Now, we compare a plasma generator according to a preferred embodiment of the invention with a plasma generator according to the related art of the invention. For example, in an RIE etching for forming trenches on a silicon, we has to calibrate a power detector every three month in order to maintain a predetermined depth and shape of trenches according to the related art of the invention.

On the other hand, when a power source of a preferred embodiment of the invention is used, there is no need for maintenance. Even if abnormal discharge occurred because a binding screw etc. of the cathode electrode 105 has loosened, the peak voltage monitoring function enables the detection of abnormality in plasma.

Thus, the plasma density in the chamber can be maintained constant and the electric power loss other than electric power used for plasma PZ can be reduced. Also, a plasma processing is stabilized, which Greatly contributes to the offer of a reliable dry etching apparatus.

Figure 17:
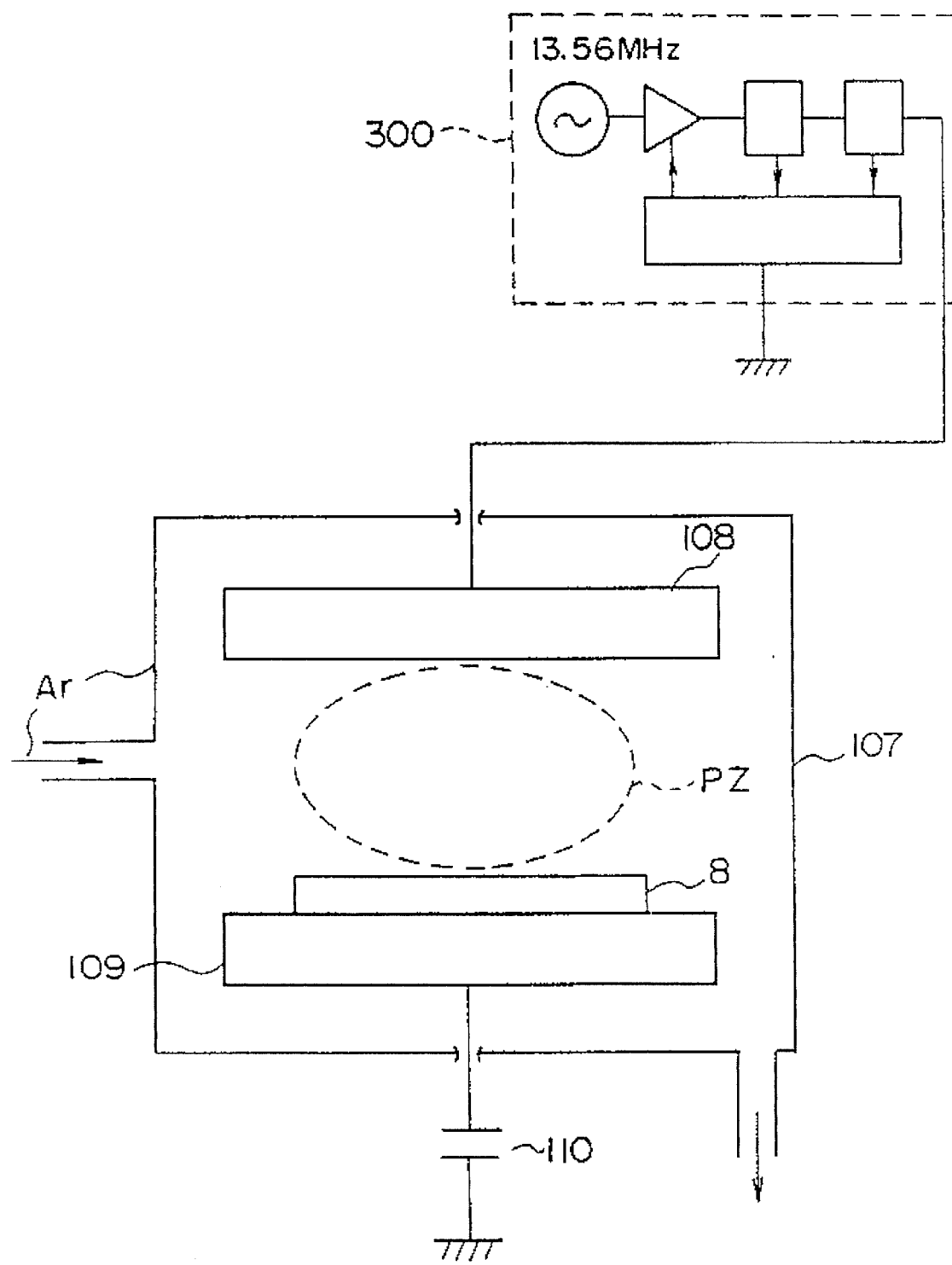
FIG. 17 is a diagram showing an arrangement of a sputtering apparatus to which an HF power source according to each embodiment of the invention is applied.

FIG. 17 shows the structure of a sputtering apparatus to which an HF power supply according to each embodiment of the invention. A sputtering apparatus for forming a film of metal atoms on a semiconductor wafer 8 comprises an HF power supply 300, a vacuum chamber 107, a target electrode 108 and a mounted electrode 109 as shown in FIG. 17.

Specifically, the HF power supply 300 is an example of the HF power supply 20 of FIG. 5 and supplies HF power to the electrode 108. The HF power supply 300 includes one or more HF power source of the first through third preferred embodiment of the invention. The combination is left to the designer's option as in case of a RF plasma CVD apparatus. It is most preferable to provide the three functions.

The target electrode 108 is provided in a vacuum chamber 107 and is connected to the power supply 300. A reaction Gas Ar is introduced into the vacuum chamber 107. The mounted electrode 109 is a one on which a semiconductor wafer 8 is set.

Next, we discuss the operation of the sputtering apparatus. For example, when HF power is supplied from the HF power supply 300 to the target electrode 108 and the mounted electrode 109 in the chamber 107, plasma PZ is Generated between the electrodes 108 and 109. During the operation, the HF power and/or the tuner set position of the matching circuit is automatically adjusted.

As described in conjunction with FIG. 17, according to a sputtering apparatus of the invention, an HF power supply 300 for supplying HF power to the mounted electrode 109 includes one or more HF power sources according to the first through third preferred embodiment of the invention.

Therefore, since the HF power supply 300 automatically adjusts the HF power and/or the tuner set position of the matching circuit, individual difference and a drift of the power detector is settled enabling the generation of plasma PZ based on stable HF electric power.

Thus, the plasma density in the chamber 107 can be maintained constant and the electric power loss other than electric power used for plasma PZ can be reduced. Also, a plasma processing is stabilized, which greatly contributes to the offer of a reliable sputtering apparatus.

(5) Explanation of a Fourth Preferred Embodiment

In a fourth preferred embodiment of the invention, unlike a plasma generator to which HF power sources of the first through third preferred embodiment are applied, the functions of the CPUs 33, 44, 55 according to the first through third preferred embodiment of the invention is applied to a power supply for generating a microwave.

Figure 18:
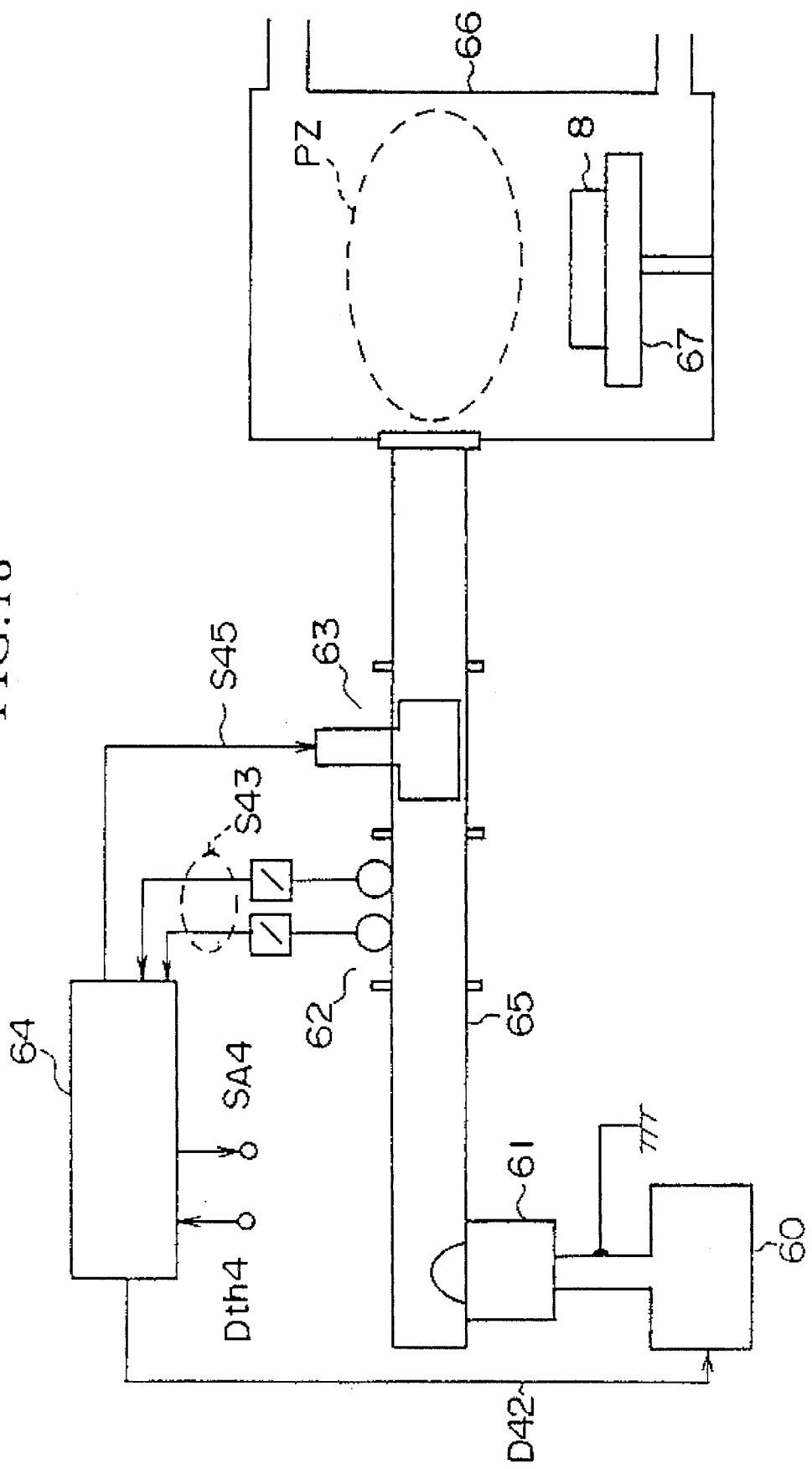
FIG. 18 is a diagram showing an arrangement of a plasma generator to which an HF (microwave) power supply according to a fourth embodiment of the invention is applied.

A plasma generator according to a fourth preferred embodiment of the invention, as shown in FIG. 18, comprises: a microwave source provided with a power supply 60, a magnetron 61, a directional coupler 62, a tuner 63, a CPU 64 and a waveguide; and a mounting pedestal 67 provided within a vacuum chamber 66. The waveguide 65 is coupled to the vacuum chamber 66 to propagate microwave power the vacuum chamber 66.

The power supply 60 comprises a DC power supply or low frequency pulse power supply. The DC power supply includes a half-wave or full-wave rectifier. The power supply 60 supplies a DC voltage or low frequency pulse signal to the magnetron 61 on the basis of control gain data D42 from the CPU 64.

The magnetron 61 is an example of the amplifier 21 of FIG. 6 and amplifies a DC voltage or low frequency pulse signal for emitting microwave power to the waveguide 65. The directional coupler 62 is an example of the power detector 22 and detects microwave power to send a detected power signal S43 to the CPU 64.

Figure 19:
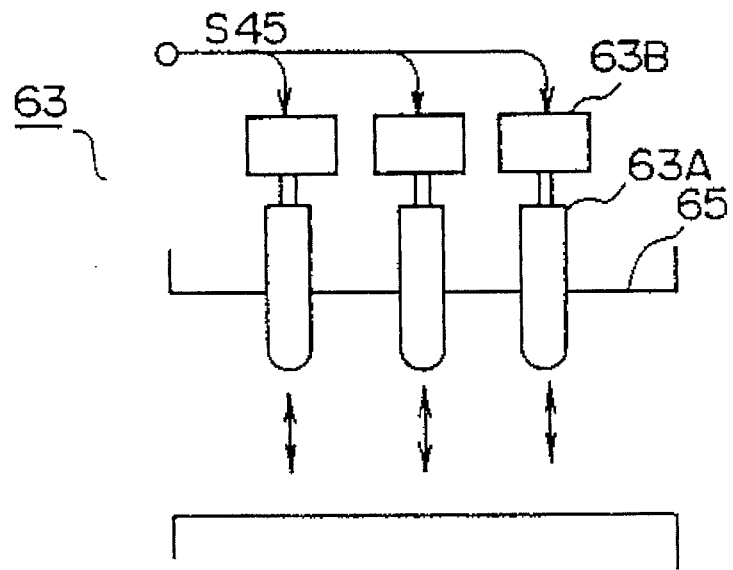
FIG. 19 is a diagram showing an arrangement of a stub tuner of the plasma generator shown in FIG. 18.

The tuner 63 is an example of the matching circuit 23 and makes impedance matching with respect to the microwave frequency. A stub tuner as shown in FIG. 19 is used for the tuner 63. The stub tuner 63 has metal cylindrical bodies 63A and motors 63B for putting and taking the respective cylindrical bodies 63A into and out of the waveguide 65. Reflected wave is returned by this to the vacuum chamber 66. The motors 63B are driven on the basis of respective motor driving signals S45 from the CPU 64.

Figure 20:
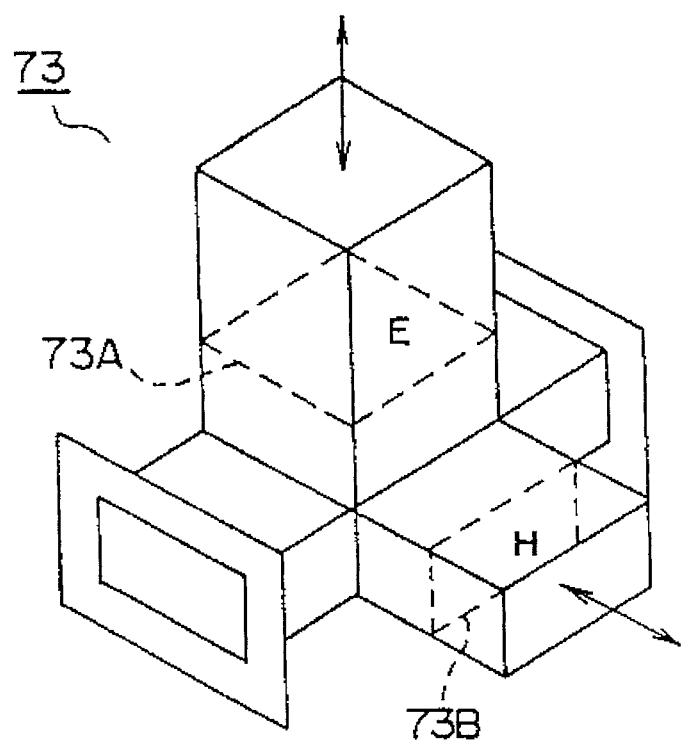
FIG. 20 is a diagram showing an arrangement of an EH tuner of the plasma generator shown in FIG. 18.

For the tuner 63, a EH tuner 73 as shown in FIG. 20 may be used. The EH tuner 73 is provided with moveable plates 73A and 73B enabling the movements of the E-plane and H-plane of the waveguide 65. The moveable plates 73A and 73B is driven by motors. The function of the EH tuner 73 is to return the reflected wave to the vacuum chamber 66 by moving the E-plane and the H-plane of the waveguide 65 to change the lengths of the waveguide 65.

The CPU 64 is an example of the control device 24 of FIG. 6 and is intended for controlling outputs/inputs of the power supply 60, the magnetron 61, the directional coupler 62 and the tuner 63. For the CPU 64, the CPU 33, 44 or 55 of the first through third HF power source of the invention is used.

Now, we discuss the operation of an HF power supply for plasma generation according to the present embodiment. For example, when a low frequency signal or a DC signal is amplified by the magnetron 61 to become a microwave, the power of the amplified microwave is detected by the directional coupler 62. With respect to the microwave, impedance matching is made by the tuner 63. During the operation, the CPU 64 sends control gain data D42 to the power supply 60. On the basis of the data D42, the output of the magnetron 61 is automatically controlled.

Thus, stable microwave power is supplied to the vacuum chamber 66 to cause plasma PZ to be generated. As described above, a plasma generator in which an HF (microwave) power supply according to the fourth preferred embodiment of the invention is utilized includes the CPU 64 having the functions of the CPUs 33, 44 and/or 55 of the first through third HF power sources of the invention and operating for controlling inputs/outputs of the magnetron 61, the directional coupler 62 and the tuner 63.

Thus, the CPU 64 enables plasma generation based on stable HF power. Also, individual difference of the directional coupler 62 can be settled by automatically controlling the output of the magnetron 61 on the basis of control gain data D42.

Further, the CPU 64 compares the control gain data D42 and initial gain data. If the comparison result is wide of the control target, a warning signal SA4 is issued, which enables notification of the occurrence of a drift of the directional coupler 62.

This improves the monitoring function of fluctuation in plasma of microwave-based systems and greatly contributes to the offer of a reliable plasma generator.

What is claimed is:

1. A high frequency power source, comprising:

an amplifier for amplifying a high frequency signal to supply a high frequency power to a load;

a power detector for detecting said high frequency power supplied to said load;

a first storage for storing power correction values obtained in advance to correct a power detection error caused by said power detector;

a first computing circuit for applying said power correction value to a power detection value detected by said power detector to correct said power detection value; and adjusting means for adjusting a gain of said amplifier according to a difference between an output value of said first computing circuit and a power set value when said high frequency power is supplied to said load.

2. A high frequency power source according to claim 1, wherein said adjusting means comprises:

a comparator for comparing said output value of said first computing circuit with said power set value;

a second computing circuit for outputting a gain adjusting value obtained by multiplying an output value of said comparator by a parameter;

a second storage for storing an upper limit value and a lower limit value both defining a gain adjustable tolerance with respect to said gain adjusting value supplied to said amplifier; and generating means for generating an alarm if said gain adjusting value exceeds said upper limit value or said lower limit value of said gain adjustable tolerance.

3. A high frequency power source comprising:

an amplifier for amplifying a high frequency signal to supply a high frequency power to a load;

a power detector for detecting said high frequency power supplied to said load;

a matching circuit for making impedance matching between said amplifier and said load;

a storage for storing a tuning position of said matching circuit corresponding to a power detection value of said power detector which is obtained in advance as a standard value;

a comparator for comparing a tuning position read out from said storage with a tuning position of said matching circuit which makes impedance matching between said amplifier and said load when said high frequency power source is in practical use; and receiving means of an output value of said comparator, said receiving means generating an alarm if a magnitude of difference between said tuning position read out from said storage and said tuning position of said matching circuit when said high frequency power source is in practical use, said high frequency power source is out of a displacement tolerance of said tuning position.

4. A high frequency power source according to claim 3, wherein said matching circuit comprises:
a tuner for making impedance matching between said amplifier and said load;
a driver for driving said tuner; and
a detector for detecting a tuning position of said tuner being driven by said driver.

5. A high frequency power source comprising:
an amplifier for amplifying a high frequency signal to supply a high frequency power to a load;
a detector for detecting an output voltage waveform from said amplifier;
a computing circuit for computing a mean value and a standard deviation of said voltage waveform derived from said detector; and
generating means for generating an alarm if said mean value and said standard deviation of said voltage waveform computed by said computing circuit exceeds a threshold set value.

6. A plasma generator comprising:
a chamber used for generating plasma; and
a high frequency power source for supplying a high frequency power to electrodes provided in said chamber,
wherein said high frequency power source comprises;
a first amplifier for amplifying a high frequency signal to output a high frequency power to said electrodes in said chamber;
a first power detector for detecting said high frequency power output from said first amplifier;
a first storage for storing power correction values obtained in advance to correct a power detection error of said first power detector;
a first computing circuit for applying a power correction value of said storage to a power detection value of said power detector to correct said power detection value; and
adjusting means for adjusting a gain of said first amplifier according to a difference between an output value of said first computing circuit and a power set value when said high frequency power is supplied to said electrodes in said chamber.

7. A plasma generator according to claim 6, wherein said adjusting means in said high frequency power source comprises:
a first comparator for comparing an output value of said first computing circuit with said power set value;
a second computing circuit for outputting a gain adjusting value obtained by multiplying an output value of said comparator by a parameter;
a second storage for storing an upper limit value and a lower limit value both defining a gain adjustable tolerance with respect to said gain adjusting value supplied to said first amplifier; and
first generating means for generating an alarm if said gain adjusting value of said second computing circuit exceeds said upper limit value or said lower limit value of said gain adjustable tolerance of said first amplifier.

8. A plasma generator according to claim 6, wherein said high frequency power source comprises:
a second amplifier for amplifying said high frequency signal to output said high frequency power to said electrodes in said chamber;
a second power detector for detecting said high frequency power output from said second amplifier;
a matching circuit for making impedance matching between said second amplifier and said electrodes in said chamber according to a power detection value detected by said second power detector;
a third storage for storing a tuning position of said matching circuit corresponding to said power detection value supplied from said second power detector which is obtained in advance as standard values;
a second comparator for comparing said tuning position read out from said third storage with said tuning position of said matching circuit which makes impedance matching between said second amplifier and said load when said plasma generator is in practical use; and
second receiving means for receiving an output value from said second comparator, and generating an alarm if a magnitude of difference between said tuning position read out from said third storage and said tuning position of said matching circuit when said high frequency power source is in practical use, said high frequency power source is out of a displacement tolerance of said tuning position.

9. A plasma generator according to claim 8, wherein said matching circuit of said high frequency power source comprises:
a tuner for adjusting a reflected wave generated between an output of said second amplifier and said electrodes in said chamber to a minimum value;
a driver for driving said tuner; and
a first detector for detecting a tuning position of said tuner driven by said driver.

10. A plasma generator according to claim 6, wherein said high frequency power source comprises:
a third amplifier for amplifying said high frequency signal to output said high frequency power;
a second detector for detecting an output voltage waveform from said third amplifier;
a third computing circuit for computing a mean value and a standard deviation of said output voltage waveform supplied from said second detector; and
third generating means for generating an alarm if said mean value and said standard deviation of said output voltage waveform computed by said third computing circuit exceeds a threshold set value.

11. A plasma generator comprising:
a chamber used for generating plasma; and
supplying means for supplying a microwave to said chamber,
wherein said supplying means comprising:
an amplifier for amplifying a DC signal or an AC signal having predetermine frequency to output a microwave;
a first detector for detecting said microwave output from said amplifier to output a microwave detection value;
a first storage for storing microwave correction value obtained in advance to correct an error in said microwave detection value detected by said first detector;
a first computing circuit for applying said microwave correction value stored in said first storage to said microwave detection value from said first detector to correct said microwave detection value; and
adjusting means for adjusting a gain of said amplifier according to a difference between an output value from said first computing circuit and a microwave output set value with respect to said chamber.

12. A plasma generator according to claim 11, wherein said adjusting means comprises:

- a first comparator for comparing said output value from said first computing circuit with a microwave output set value;
- a second computing circuit for outputting a gain adjusting value obtained by multiplying an output value from said first comparator by a parameter;
- a second storage for storing an upper limit value and a lower limit value both defining a gain adjustable tolerance with respect to said gain adjusting value supplied to said amplifier; and
- first generating means for generating an alarm if said gain adjusting value supplied to said amplifier exceeds said upper limit value or said lower limit value of said gain adjustable tolerance of said amplifier.

13. A plasma generator according to claim 11, wherein said supplying means comprises:

- an amplifier for amplifying said DC signal or said AC signal having said predetermined frequency to output said microwave;
- a first detector for detecting said microwave output from said amplifier to output said microwave detection value;
- a matching circuit for making matching between said amplifier and said chamber according to said microwave detection value from said first detector;
- a third storage for storing a tuning position of said matching circuit obtained in advance as a standard value corresponding to said microwave detection value from said first detector;
- a second comparator for comparing said tuning position read out from said third storage with said tuning position of said matching circuit which makes matching between said amplifier and said chamber when said plasma generator is in practical use; and
- a receiving means for receiving an output value from said second comparator, and generating an alarm if a magnitude of difference between said tuning position read out from said third storage and said tuning position of said matching circuit when said plasma generator is in practical use, said high frequency power source is out of a displacement tolerance of said tuning position.

14. A plasma generator according to claim 13, wherein said matching circuit comprises:

- a tuner for making matching between said amplifier and said chamber;
- a driver for driving said tuner; and
- a second detector for detecting a tuning position of said tuner driven by said driver.

\* \* \* \* \*